(12) United States Patent
Tanaka et al.

(10) Patent No.: US 8,729,573 B2
(45) Date of Patent: May 20, 2014

(54) LED LIGHTING DEVICE

(75) Inventors: Kenichiro Tanaka, Neyagawa (JP); Takanori Aketa, Hirakata (JP)

(73) Assignee: Panasonic Corporation, Osaka (JP)

( * ) Notice: Subject to any disclaimer, the term of this patent is extended or adjusted under 35 U.S.C. 154(b) by 784 days.

(21) Appl. No.: 12/670,110

(22) PCT Filed: Jul. 25, 2008

(86) PCT No.: PCT/JP2008/063437
§ 371 (c)(1),
(2), (4) Date: Jan. 21, 2010

(87) PCT Pub. No.: WO2009/014219
PCT Pub. Date: Jan. 29, 2009

(65) Prior Publication Data
US 2010/0207134 A1    Aug. 19, 2010

(30) Foreign Application Priority Data

Jul. 26, 2007   (JP) .................................. 2007-195151
Jul. 26, 2007   (JP) .................................. 2007-195162
Mar. 13, 2008  (JP) .................................. 2008-064878

(51) Int. Cl.
*H01L 33/48*        (2010.01)
(52) U.S. Cl.
USPC ......... 257/89; 257/E33.056; 313/500; 445/24
(58) Field of Classification Search
USPC ........ 257/89, 98, E33.056, E33.061, E33.067
See application file for complete search history.

(56) References Cited

U.S. PATENT DOCUMENTS

| 7,800,121 | B2* | 9/2010 | Aanegola et al. ................ 257/98 |
| 8,395,311 | B2* | 3/2013 | Morimoto ..................... 313/500 |
| 2004/0105261 | A1* | 6/2004 | Ducharme et al. ............ 362/231 |
| 2004/0264193 | A1 | 12/2004 | Okumura | |
| 2005/0116635 | A1 | 6/2005 | Walson et al. | |

(Continued)

FOREIGN PATENT DOCUMENTS

| CN | 1902519 A | 1/2007 |
| EP | 1 780 592 A1 | 5/2007 |

(Continued)

OTHER PUBLICATIONS

International Search Report for the Application No. PCT/JP2008/063437 mailed Aug. 19, 2008.

(Continued)

*Primary Examiner* — Minh-Loan T Tran
*Assistant Examiner* — Fazli Erdem
(74) *Attorney, Agent, or Firm* — McDermott Will & Emery LLP

(57) ABSTRACT

An LED lighting device comprises a plurality of light emitting units which is configured to emit visible light having different colors which are mixed with each other to produce a white light. Each the light emitting units is composed of an LED chip and a phosphor. The LED chip is configured to generate light. The phosphor has a property of giving off a light of a predetermined color when the phosphor is excited by the light from the LED chip. The LED chip is selected from a group consisting of a blue LED chip, a UV LED chip, ad a violet LED chip. Each the phosphor is selected to give off the light of a predetermined color different from one another.

19 Claims, 17 Drawing Sheets

(56) References Cited

U.S. PATENT DOCUMENTS

| | | | |
|---|---|---|---|
| 2005/0127381 A1* | 6/2005 | Vitta et al. | 257/88 |
| 2005/0225561 A1* | 10/2005 | Higgins et al. | 345/600 |
| 2005/0269932 A1* | 12/2005 | Ng et al. | 313/485 |
| 2007/0291467 A1* | 12/2007 | Nagai et al. | 362/84 |
| 2008/0030518 A1* | 2/2008 | Higgins et al. | 345/589 |
| 2008/0106895 A1* | 5/2008 | Van De Ven et al. | 362/231 |
| 2008/0136313 A1* | 6/2008 | Van De Ven et al. | 313/500 |
| 2008/0303410 A1* | 12/2008 | Kaneda et al. | 313/503 |
| 2009/0002604 A1* | 1/2009 | Morimoto | 349/71 |
| 2009/0140630 A1* | 6/2009 | Kijima et al. | 313/498 |
| 2009/0184616 A1* | 7/2009 | Van De Ven et al. | 313/1 |
| 2010/0067214 A1* | 3/2010 | Hoelen et al. | 362/84 |
| 2010/0315012 A1* | 12/2010 | Kim et al. | 315/185 R |
| 2011/0249431 A1* | 10/2011 | Tanaka | 362/227 |
| 2012/0326631 A1* | 12/2012 | Naruo et al. | 315/297 |

FOREIGN PATENT DOCUMENTS

| | | | |
|---|---|---|---|
| EP | 1 840 977 A1 | 10/2007 | |
| EP | 1 865 564 A1 | 12/2007 | |
| GB | 2373368 A | 9/2002 | |
| JP | 06-052992 | 2/1994 | |
| JP | 2006-148051 A | 6/2006 | |
| JP | 2006-295230 A | 10/2006 | |
| JP | 2006-309209 A | 11/2006 | |
| JP | 2007-80862 A | 3/2007 | |
| JP | 2007-82820 A | 4/2007 | |
| JP | 2007-122950 A | 5/2007 | |
| JP | 2007-180066 | 7/2007 | |
| WO | WO-03/019072 A1 | 3/2003 | |
| WO | WO-2005/112137 A1 | 11/2005 | |
| WO | WO-2006/001221 A1 | 1/2006 | |

OTHER PUBLICATIONS

The First Office Action for the Application No. 200880100643.6 from The State Intellectual Property Office of the People's Republic of China dated Jan. 11, 2011.

Extended European Search Report issued in European Patent Application No. 08791681.3 mailed on Aug. 9, 2013.

Schubert, E. Fred. "Light-Emitting Diodes" Cambridge University Press, Cambridge, USA, four pages, 2006.

* cited by examiner

LED LIGHTING DEVICE

TECHNICAL FIELD

This invention relates to an LED lighting device which comprises a plurality of light emitting units. Each one of the light emitting units is configured to emit the light having a color which is different from colors of the lights which are emitted from the other light emitting units. Consequently, the LED lighting device in this invention is configured to produce light having a desired color.

BACKGROUND ART

PCT patent application publication No 03/019072A discloses a prior LED lighting device. The prior LED lighting device having a plurality of light emitting units on a circuit board. Each the light emitting unit is configured to emit the light having color which is different from the color of the light emitted from the other light emitting unit. The LED lighting device comprises a plurality of the light emitting units which is cooperative with each other to produce light having a desired color temperature. In this manner, the LED lighting device is configured to produce a white light.

The prior LED lighting device comprises a first light emitting unit, a second light emitting unit, and a third light emitting unit. The first light emitting unit is composed of a blue LED chip and a YAG phosphor. The blue LED chip includes indium, gallium, and nitrogen (InGaN). The blue LED chip is configured to emit light having an emission peak wavelength of 450 to 460 nm. The YAG phosphor includes yttrium aluminum garnet. In the first light emitting unit, the blue LED chip emits the light which excites the YAG phosphor, whereby the first light emitting unit emits a white light. The first light emitting unit is adjusted to emit the light having a desired color temperature on the blackbody locus. The second light emitting unit is composed of a orange LED chip which includes AlInGaP. The second light emitting unit is configured to emit light having an emission peak wavelength of 590 nm. The third light emitting unit is composed of a blue LED chip which is configured to emit light having an emission peak wavelength of 470 to 480 nm. The second light emitting unit and the third light emitting unit are act as auxiliary light sources of the first light emitting unit. The LED lighting device comprises the first light emitting unit, the second light emitting unit, and the third light emitting unit which are combined with each other to produce the light having the desired color temperature. The LED lighting device as mentioned above is used as shadowless lights, interior lamps, and so on.

DISCLOSURE OF THE INVENTION

The above LED lighting device comprises the light emitting units which have the LED chip respectively. Types of each one of the LED chips are different from the other LED chips. The LED chips respectively have initial characterizations which are different from each other. Further, the LED chips respectively have aged deterioration properties which are also different from each other. The initial characterizations and the aged deterioration properties vary the color of the light which is generated from the LED chips. Therefore, the LED lighting device is configured to emit the light which is gradually varied by ambient environments thereof and the aged deterioration properties. That is, the LED lighting device faces a problem of a color shift which is caused according to usage of the LED lighting device. In order to solve this problem, the prior LED lighting device further comprises a plurality of light detection element and a controller. The light detection element is configured to detect the light which is emitted from the light emitting unit. The controller is configured to regulate an amount of electrical current which is supplied to each the LED chip on the basis of the light which is detected by the light detection element. In this case, the LED lighting device requires the light detection elements and the controller. The light detection elements and the controller lead to high-cost of the LED lighting device.

The invention is achieved to solve the above problem. An object in this invention is to provide a LED lighting device which is configured to produce the light being free from the color shift, and which is low-cost.

In order to solve the above problem, an LED lighting device comprises a plurality of light emitting units. A plurality of the light emitting unit is configured to emit visible lights which have different colors. The different colors of the visible lights are mixed with each other to produce a white light. Each the light emitting unit is composed of an LED chip and a phosphor. The LED chip is configured to generate light. The phosphor has a property of giving off a light of a predetermined color when the phosphor is excited by the light from the LED chip. The feature of the invention resides in that the LED chip is selected from a group consisting of a blue LED chip, a UV LED chip, and a violet LED chip. Each the phosphor is selected to give off the light of a predetermined color which is different from one another. With this configuration, the LED lighting device has the LED chips having a characteristic which are similarly varied by the ambient environment and the aged deterioration. Furthermore, the LED lighting device comprises the light emitting units which have the phosphors which are different from each other. Therefore, the LED lighting device is configured to produce the white light only by illuminating the light emitting units. Consequently, it is possible to obtain the LED lighting device which is configured to generate the light that the color shift is prevented. Therefore, the LED lighting device with this configuration has high color reproducibility of the light. Furthermore, it is also possible to obtain the LED lighting device of low-cost.

It is desired for the LED lighting device to have the high color reproducibility of the light. Therefore, it is preferred that the light emitting units are configured to emit the light having colors which respectively correspond to chromaticity points on x,y, chromaticity diagram. The chromaticity points of the color of the light emitted from the light emitting units are located at corners of a polygonal shape. The polygonal shape surrounds a triangle which is determined on the basis of the blackbody locus of the x,y, chromaticity diagram of XYZ color system. The triangle has three corners which are respectively defined as a first chromaticity point, a second chromaticity point, and a third chromaticity point. The first chromaticity point is located on the blackbody locus. The first chromaticity point is determined on the basis of a desired mixed color light. The second chromaticity point is located on the blackbody locus. The second chromaticity point is determined on the basis of the desired mixed color light. The third chromaticity point is located at an intersection of a first tangential line at the first chromaticity point on the blackbody locus and a second tangential line at the second chromaticity point on the blackbody locus. In this case, the LED lighting device is configured to produce the light having high color reproducibility.

It is preferred that the LED lighting device comprises three light emitting units. Furthermore, it is preferred that the LED lighting device comprising a first light emitting unit, a second light emitting unit, and a third light emitting unit. The first light emitting unit is composed of the LED chip and the phosphor. The first light emitting unit is configured to emit a red light which is produced by mixing the light generated from the LED chip of the first light emitting unit with the light given off from the phosphor of the first light emitting unit. The second light emitting unit is composed of the LED chip and the phosphor. The second light emitting unit is configured to emit a green light which is produced by mixing the light generated from the LED chip of the second light emitting unit with the light given off from the phosphor of the second light emitting unit. The third light emitting unit is composed of the LED chip and the phosphor. The third light emitting unit is configured to emit a blue light by mixing the light generated from the LED chip of the third light emitting unit with the light given off from the phosphor of the third light emitting unit. This configuration prevents the first light emitting unit from absorbing the green light emitted from the second light emitting unit. Therefore, this configuration prevents the green light from being converted into the red light.

The above light emitting units are desired to have approximately the same initial characterizations. In addition, the above light emitting units are desired to have approximately the same aged deterioration properties. Therefore, it is preferred that each the light emitting unit share plural kinds of the phosphors in common. The light emitting units includes the kinds of the phosphors in respective mixture ratios different from each other. This configuration prevents the light generated from the LED lighting device from causing the color shift. Therefore, it is possible to obtain the LED lighting device which is configured to produce the light having high color reproducibility.

It is also preferred that the LED lighting device comprises a first light emitting unit having a first blue LED chip, a second light emitting unit having a second blue LED chip, and a third blue LED chip with a light diffusion member. The first blue LED chip is same in type with respect to the second blue LED chip and the third blue LED chip. The first light emitting unit has the phosphor which is configured to give off the red light when the phosphor is excited by the light from the first blue LED chip. The second light emitting unit has the phosphor which is configured to give off the green light when the phosphor is excited by the light from the second blue LED chip. The light diffusion member is configured to diffuse the blue light from the third blue LED chip. The LED lighting device with this configuration is also configured to produce the light which is free from the color shift.

In a case where the above light emitting units are respectively disposed in individual packages, the lights emitted from the light emitting units are mixed with each other before the lights reach an irradiated area. Thereafter, the mixed light is reached to the irradiated area. However, when an object is located between the LED lighting device and the irradiated area, the color of the light is separated around a shadow of the object. Therefore, it is preferred that the LED lighting device further comprises a package. The package incorporates the light emitting units in the package. The phosphor is disposed to overlap with the LED chip, respectively. Each the light emitting unit is arranged adjacent to the other light emitting unit within the package. In this case, the light is free from the color separation around the shadow of the object.

In a case where a plurality of the light emitting units is disposed in the package, it is desired that the lights from the light emitting units are mixed with each other in the package. Thereafter, the mixed color light is irradiated from the package. Therefore, it is preferred that the package is composed of a substrate and a sealing cap. The substrate has one surface which mounts a plurality of the light emitting units. The sealing cap is cooperative with the substrate to seal the light emitting unit therein. The sealing cap is made of transparent material which includes a light diffusion member. In this case, the light diffusion member is configured to diffuse the lights which are emitted from the light emitting units. The lights emitted from the light emitting units are mixed with each other in the sealing cap. Thereafter, the mixed light is irradiated from the sealing cap. That is, the sealing cap having the light diffusion member prevents the light produced by the LED lighting device from separating the color around the shadow of the object.

It is desired that each one of the light emitting units is configured to emit the lights with no effect of the light emitted from the other light emitting units. Therefore, it is preferred that the package further including a light interceptor. The light interceptor is located between the light emitting units adjacent to each other. The light interceptor is shaped to intercept the light sent from the one of the light emitting unit to the other one of the light emitting unit. In this case, each one of the light emitting units is configured to emit the light having a predetermined color with no effect of the light from the other light emitting unit.

It is also preferred that the package further includes a light reflector. The light reflector is located between the light emitting units adjacent to each other. The light reflector is shaped to intercept the light sent from the one of the light emitting units to the other light emitting unit.

It is also preferred that each the light emitting unit further includes a frame. The frame surrounds the phosphor over an entire side surface of the phosphor. The frame is shaped to reflect the light from the phosphor. In this case, it is also possible for each one of the light emitting units to produce a predetermined color of light with no effect of the light emitted from the other light emitting units.

It is preferred that the frame is formed with an opening which has an opening area which gradually increases toward a direction away from the LED chip. In this case, it is possible to reduce an amount of the light blocked by the frame. Therefore, this configuration makes it possible for the LED lighting device to produce a large amount of the light toward a predetermined direction.

In contrast, it is preferred that the LED lighting device is configured to emit the mixed color light having a white color within a desired color temperature range. The desired color temperature range is defined by a blackbody locus of x,y, chromaticity diagram of XYZ color system. The LED lighting device comprises a red light emitting unit, a green light emitting unit, and a blue light emitting unit. The red light emitting unit is configured to emit a red light which is produced by mixing the light generated from the LED chip of the red light emitting unit with the light which is given off from the phosphor of the red light emitting unit. The green light emitting unit is configured to emit a green light which is produced by mixing the light generated from, the LED chip of the green light emitting unit with the light which is given off from the phosphor of the green light emitting unit. The blue light emitting unit is configured to emit a blue light produced by mixing the light generated from the LED chip of the blue light emitting unit with the light which is given off from the phosphor of the blue light emitting unit. A first line is defined as connecting a chromaticity point of the color of the light which is emitted from the blue light emitting unit and a chromaticity point of the color of the light which is emitted from the green light emitting unit. The first line passes through a high-temperature end of the blackbody locus within a predetermined color temperature range. A second line is defined as connecting a chromaticity point of the color of the light which is emitted from the red light emitting unit and the chromaticity point of the color of the light which is emitted from the green light emitting unit. The second line passes through a low-temperature end of the blackbody locus within a predetermined color temperature range. A third line is defined as connecting a chromaticity of the color of the light which is emitted from the blue emitting unit and a chromaticity point of the color of the light which is emitted from the red light emitting unit. The third line has Y-axis value of the chromaticity coordinate. A fourth line is defined as connecting the high-temperature end and the low-temperature end. The Y-axis value of the third line is smaller than Y-axis value of the fourth line. In this case, it is possible to highly accurate the color temperature of the LED lighting device.

BRIEF EXPLANATION OF THE DRAWINGS

FIG. 5 (b) is a side cross sectional view of the LED lighting device of the second embodiment.

FIG. 8 (b) is a side cross sectional view of the light emitting unit of the third embodiment.

FIG. 9 (b) is a side cross sectional view of the light emitting unit in the first modification.

FIG. 10 (b) is a side cross sectional view of the light emitting unit in the second modification.

FIG. 11 (b) is a side cross sectional view of the light emitting unit in the third modification.

FIG. 12 (b) is a side cross sectional view of the light emitting unit in the fourth modification.

FIG. 13 (b) is a side cross sectional view of the light emitting unit in the fifth modification.

BEST MODE FOR CARRYING OUT THE INVENTION

First Embodiment

Figure 1:
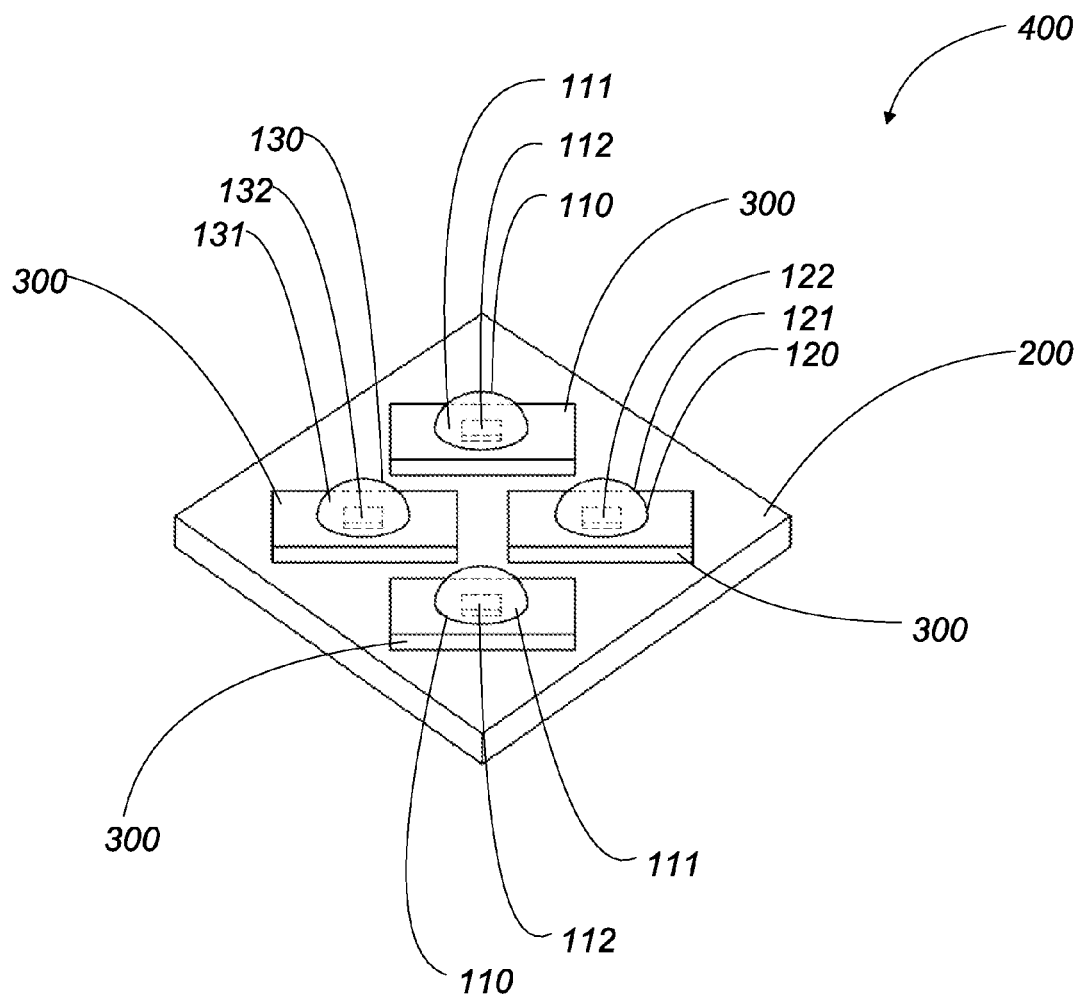
FIG. 1 is a schematic perspective view of a LED lighting device of the first embodiment.

An LED lighting device of the first embodiment is explained with attached illustrations. FIG. 1 shows a schematic perspective view of the LED lighting device of the first embodiment. The LED lighting device 400 of the first embodiment comprises a circuit substrate 200, mounting substrates 300, a light emitting unit 110, a light emitting unit 120, and a light emitting unit 130. The light emitting unit 110, 120, and 130 are respectively mounted on the mounting substrates 300. The mounting substrates 300 are respectively mounted on the circuit substrate 200. The circuit substrate 200 is configured to receive an electrical power from outside, and is configured to supply the light emitting units 110, 120, and 130 with the electrical power. The light emitting units 110, 120, and 130 is configured to emit a light having a desired color. The light emitting units 110, 120, and 130 are configured to emit visible lights which have colors which are different from each other. The visible lights are mixed with each other to produce a white light, whereby the LED lighting device is configured to emit the white light. The LED lighting device is directed to a predetermined direction. Consequently, the LED lighting device is configured to produce the light which travels toward a predetermined direction.

The circuit substrate 200 is provided at its one surface with a wiring which is not shown. The wiring is provided for supplying the electrical power to the light emitting units 110, 120, and 130. The circuit substrate 200 is formed to into plate, and is formed to have a rectangular shape. However, circuit substrates having other shapes are also employed as the circuit substrate 200.

The light emitting unit 110 includes a violet LED chip 112 and a color conversion member 111. The light emitting unit 120 includes a violet LED chip 122 and a color conversion member 121. The light emitting unit 130 includes a violet LED chip 132 and a color conversion member 131. The violet LED chips 112, 122, and 132 respectively have emission layers which are made of same composition. The violet LED chips 112, 122, and 132 are configured to emit the lights having same emission peak wavelengths, respectively. The violet LED chips 112, 122, and 132 respectively have the emission layers each have same structure. Each the color conversion member 111, 121, and 131 is composed of a phosphor and a transparent material. The phosphors have properties of being excited by the light emitted from the violet LED chips 112, 122, and 132, whereby the phosphors have properties of giving off a predetermined color light when the phosphors are excited. The color conversion member 111 includes a red phosphor which has a property of giving off the red light when the red phosphor is excited by the light generated from the violet LED chip 112. That is, the light emitting unit 110 is configured to emit the red light which is produced by mixing the light generated from the LED chip 112 with the light given off from the red phosphor. The color conversion member 121 includes a green phosphor which has a property of giving off the green light when the green phosphor is excited by the light generated from the violet LED chip 122. That is, the light emitting unit 120 is configured to emit the green light by mixing the light generated from the LED chip 122 with the light given off from the green phosphor. The color conversion member 131 includes a blue phosphor which has a property of giving off the light when the blue phosphor is excited by the light emitted from the violet LED chip 132. That is, the light emitting unit 130 is configured to emit the blue light by mixing the light generated from the LED chip 132 with the light given off from the blue phosphor. Therefore, the light emitting unit 110 acts as a red light source being configured to emit the red light. The light emitting unit 120 acts as a green light source being configured to emit the green light. The light emitting unit 130 acts as a blue light source being configured to emit the blue light. The transparent material is exemplified by a glass and a silicone resin. The phosphor is mixed with the transparent material. The color conversion members 111, 121, and 131 are respectively formed to have a dome shape. The color conversion members 111 is cooperative with the mounting substrate 300 to incorporate the violet LED chip 112 between the color conversion member 111 and the mounting substrate 300. The color conversion member 121 is cooperative with the mounting substrate 300 to incorporate the violet LED chip 122 between the color conversion member 121 and the mounting substrate 300. The color conversion member 131 is cooperative with the mounting substrate 300 to incorporate the violet LED chip 132 between the color conversion member 131 and the mounting substrate 300. It is noted that the mounting substrates 300 are made of a ceramic substrate. However, the mounting substrate 300 is not limited to the ceramic substrate. In addition, each the violet LED chip 112, 122, and 132 has property of generating the light having the emission peak wavelength which is shorter than the emission peak wavelength of the light which is given off from the phosphors. Therefore, it is possible to employ light emitting units having UV LED chips and blue LED chips instead of the violet LED chips.

Each one of the light emitting units 110, 120, and 130 has a sealant which is not shown. The sealant is provided for sealing the LED chips 112, 122, and 132 at an inside of the color conversion members 111, 121, and 131. It is possible to employ the sealant with light diffusion members. The light diffusion member is configured to reflect the light generated from the LED chips 112, 122, and 132. The light generated from the LED chips 112, 122, and 132 are diffused by the light diffusion member of the sealant. That is, the light diffusion member of the sealant is configured to reduce directionality of the light generated from the LED chips 112, 122, and 132. Therefore, this configuration makes it possible to effectively mix the lights which are emitted from the light emitting units 110, 120, and 130.

Figure 2:
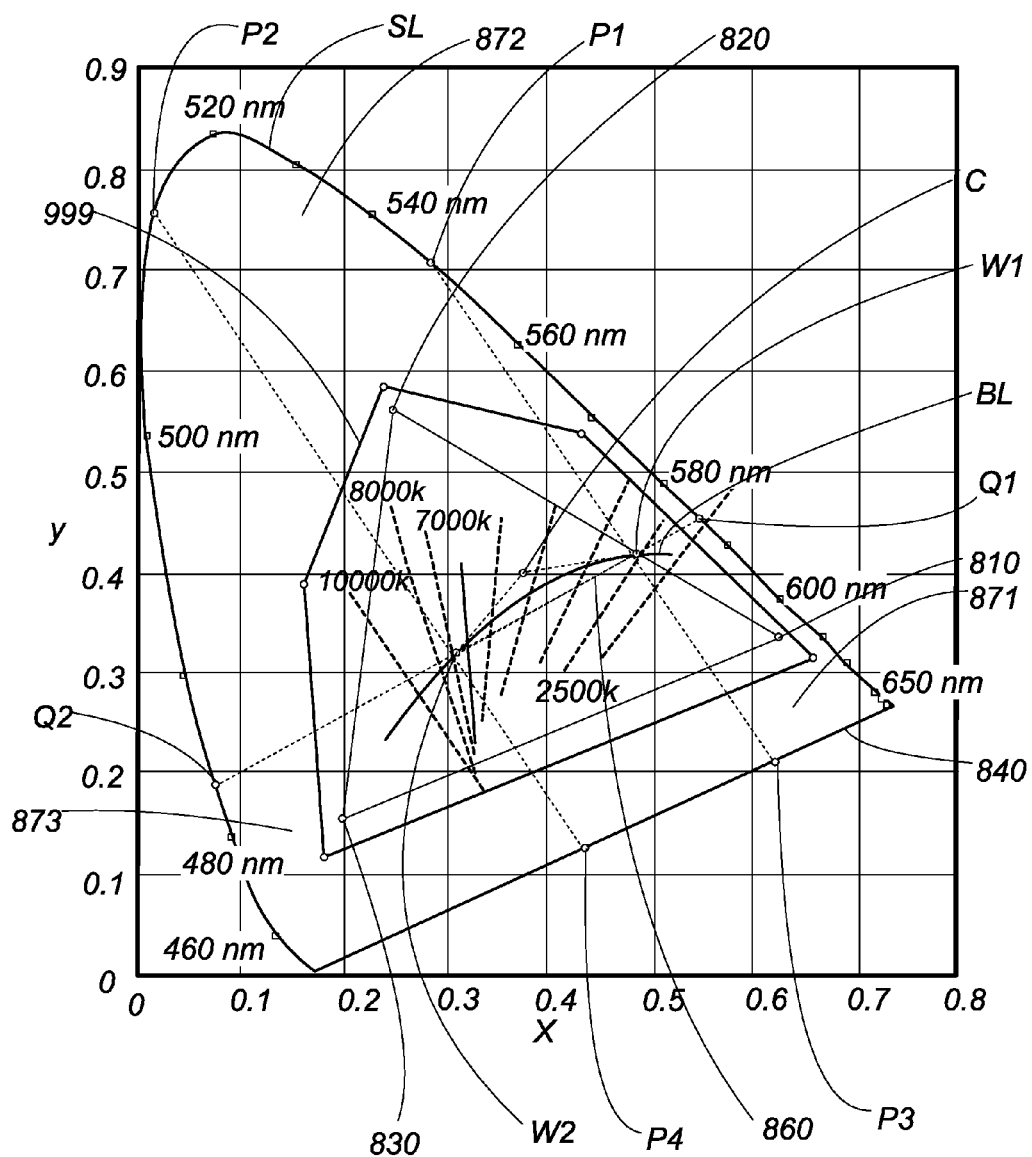
FIG. 2 is a x,y, chromaticity diagram showing a color temperature of the light. The light having a color temperature is emitted from the light emitting unit of the LED lighting device of the first embodiment.

The LED lighting device 400 are designed as follows. FIG. 2 shows a x,y, chromaticity diagram of XYZ color system, and also shows blackbody locus BL on the x,y, chromaticity diagram. In FIG. 2, a chromaticity point 810 shows the color of the light emitted from the light emitting unit 110. A chromaticity point 820 shows the color of the light emitted from the light emitting unit 120. A chromaticity point 830 shows the color of the light emitted from the light emitting unit 130. The chromaticity points 810, 820, and 830 define a triangle 840. This triangle 840 surrounds a triangle 860 on x,y, chromaticity diagram. The triangle 860 is determined by reference of the blackbody locus BL of the x,y, chromaticity diagram of the XYZ color system. The triangle 860 has three corners of a first chromaticity point W1, a second chromaticity point W2, and a third chromaticity point C. The first chromaticity point W1 is located on the blackbody locus BL of the x,y, chromaticity diagram of the XYZ color system. The second chromaticity point W2 is located on the blackbody locus BL of the x,y, chromaticity diagram of the XYZ color system, and is located at a position apart from the first chromaticity point W1. The blackbody locus BL has a first tangential line at a first chromaticity point W1 and a second chromaticity point W2. The third chromaticity point C is located at an intersection of a first tangential line and a second tangential line. It is noted that the LED lighting device comprises the three light emitting units 110, 120, and 130. Therefore, the chromaticity points of the color of the light emitted from the light emitting units 110, 120, and 130 forms the triangle 840. However, the number of the light emitting units is not limited to the three. When the LED lighting device comprises a plurality of the light emitting units more than three, the chromaticity points of the colors of the lights emitted from the light emitting units forms a polygonal shape. For example, it is possible for the LED lighting device to employ five light emitting units. In this case, the five chromaticity points of the color of the lights emitted from the five light emitting units form a pentagon 999. That is, it is only required for the light emitting units to emit the light having the colors corresponding to the chromaticity points which forms a polygon surrounding a triangle 860.

The LED lighting device is configured to produce the light having the color within the triangle 840 having the corners of the chromaticity point 810, 820, and 830. In this embodiment, the LED lighting device is configured to produce the white light.

The LED lighting device in this embodiment comprises the light emitting units 110, 120, and 130. Each one of the light emitting units 110, 120, and 130 includes the violet LED chip 112, 122, 132. All the LED chips 112, 122, and 132 respectively have the emitting layers which are made of the same composition. All the violet LED chips 112, 122, and 132 are configured to emit the light having the same emission peak wavelengths. All the violet LED chips 112, 122, and 132 have the emission layer each have the same structure. Therefore, each one of the violet LED chips 112, 122, and 132 has the initial characterization which is same as the initial characterizations of the other violet LED chips 112, 122, and 132. The violet LED chips 112, 122, and 132 are similarly varied by the ambient environment and the aged deterioration, respectively. Therefore, it is possible to obtain the LED lighting device which is prevented from the color shift caused by the ambient environment and the aged deterioration. In addition, the light emitting units 110, 120, and 130 respectively have color conversion members 111, 121, and 131 which are different from each other. Consequently, it is possible to obtain the LED lighting device which has the high color reproducibility only by illumination of the light emitting units 110, 120, and 130. In addition, the lights are given off from the phosphors of the color conversion member excited by the lights from the LED chips. Therefore, the light emitting units 110, 120, and 130 are configured to emit the light having low directionality. Therefore, it is possible to obtain the LED lighting device having the light emitting units 110, 120, and 130 which are configured to emit the lights which are easily mixed with each other.

In addition, it is possible to manufacture the LED lighting device by preparing the different color conversion members 111, 121, and 131 for the light emitting units 110, 120, and 130 respectively. Therefore, each the light emitting units 110, 120, and 130 is easily manufactured. In addition, it is possible to manufacture the LED lighting device which is prevented from the color shift.

By the way, it is preferred that the light emitting unit 110 (which acts as the red light source) is designed to emit the light having the color corresponding to the chromaticity point 810 being located within a region 871 of the x,y, chromaticity diagram shown in FIG. 2. The region 871 is surrounded by a line connecting a chromaticity point Q1 and a chromaticity point W1, a line connecting the chromaticity point W1 and a chromaticity point P3, and a line between the chromaticity point Q1 and the chromaticity point P3 along a spectral locus SL. Similarly, it is preferred that the light emitting unit 120 (which acts as the green light source) is designed to emit the light having the color corresponding to the chromaticity point 820 being located within a region 872. The region 872 is surrounded by a curving line between the chromaticity point W1 and the chromaticity point W2 and along the spectral locus SL, a line connecting the chromaticity point W2 and the chromaticity point P2, and the line connecting the chromaticity point P1 and the chromaticity point W1. Similarly, it is preferred that the light emitting unit 130 (which acts as the blue light source) is designed to emit the light having the color corresponding to the chromaticity point 830 being located within a region 873. The region 873 is surrounded by a straight line connecting the chromaticity point W2 and the chromaticity point P4, a line connecting the chromaticity point P4 and the chromaticity point Q2 long the spectral locus SL, and a line connecting the chromaticity point Q2 and the chromaticity point W2. Here, the x,y, chromaticity diagram in FIG. 2, the chromaticity point P1 and the chromaticity point P3 are respectively is determined as intersections of the spectral locus SL and a line parallel to a bisector of an angle at the corner C (chromaticity point) of the triangle 860. The line parallel to the bisector of the angle at the corner C passes through the chromaticity point W1. Similarly, the chromaticity point P2 and P4 is determined by intersections of the spectral locus SL and a line parallel to the bisector of an angle at the corner C of the triangle 860. The line parallel to the bisector of an angle at the corner C of the triangle 860 passes through the W2. The chromaticity point Q1 and the chromaticity point Q2 are respectively determined by intersections of the spectral locus SL and a line connecting the chromaticity point W1 and the chromaticity point W2. It is preferred that the chromaticity point 810, 820, and 830 are respectively located within the region 871, 872, and 873. Consequently, it is possible to obtain the LED lighting device having the high color reproducibility.

In addition, the light emitting unit 100 includes the red phosphor. The light emitting unit 120 includes the green phosphor. The light emitting unit 130 includes the blue phosphor. In this case, it is possible to prevent secondary absorption of a part of the green light emitted from the green phosphor by the red phosphor. Therefore, it is possible to increase luminance efficiency of the phosphor.

On the other hand, it is also preferred that the color conversion member 111, 121, and 131 share plural kinds of the phosphors in common. This is explained as a first modification of the first embodiment. Table 1 shows mixture ratios of the plural phosphors of the color conversion members 111, 121, and 131. The color conversion members 111, 121, and 131 include the red phosphor and the green phosphor. The color conversion member 111, 121, and 131 include the kinds of the phosphors in respective mixture ratio different from each other. In addition, the color conversion member 111, 121, and 131 include the kinds of the phosphors in respective concentration different from each other.

Therefore, the light emitting unit 110 includes the red phosphor and the green phosphor, and is configured to emit the red light by mixing the light generated by the LED chip 112 with the light given off from the red phosphor and the green phosphor. The light emitting unit 120 includes the red phosphor and the green phosphor, and is configured to emit the green light by mixing the light emitted from the LED chip 122 with the light given off from the red phosphor and the green phosphor. The light emitting unit 130 includes the red phosphor and the green phosphor, and is configured to emit the blue light by mixing the light emitted from the LED chip 132 with the light given off from the red phosphor and the green phosphor.

In this case, the phosphors of the light emitting units 110, 120, and 130 has approximately the same initial characterization. Similarly, in this case, the phosphors of the light emitting units 110, 120, and 130 also has approximately the same aged deterioration properties. Therefore, this configuration makes it possible for the LED lighting device to prevent the color shift caused by the ambient environment and the aged deterioration. In addition, this configuration also makes it possible for the LED lighting device to have the high color reproducibility. However, mixture ratio and concentration of the phosphors is not limited to the ratio and the concentration shown in Table 1.

TABLE 1

| | Light source for exciting the phosphor | Red phosphor:Green phosphor (ratio) | Concentration of Phosphor |
| --- | --- | --- | --- |
| Red light source | Blue LED chip | 31.9:68.1 | 10.7 |
| Green light source | Blue LED chip | 97.7:2.3 | 9.0 |
| Blue light source | Blue LED chip | 19.6:80.4 | 2.9 |

It is noted that it is possible to employ more than three kinds of the phosphors to the above phosphors. For example, it is possible to achieve the same effect by employing three phosphors of an yellow-green phosphor, an yellow phosphor, and an orange phosphor. In addition, it is also possible to obtain the same effect by employing three phosphors of the green phosphor, a first red phosphor, and a second red phosphor which is different in an emission spectrum from the first red phosphor.

Figure 3:
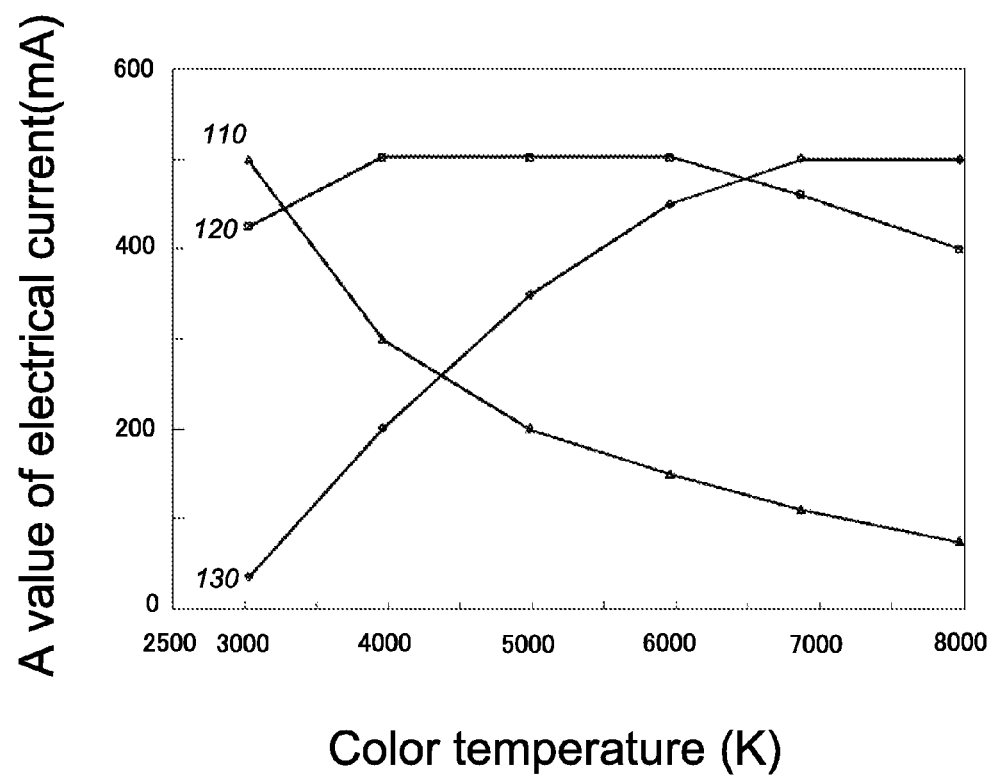
FIG. 3 is a graph showing a relationship between the color temperature of the light and an electrical current. The light having the color temperature is emitted from the light emitting unit. The electrical current is supplied to the light emitting unit of the LED lighting device of the first embodiment.

It is preferred that the LED lighting device further comprises a control unit (not shown in the illustrations) being configured to control a drive circuit for driving the light emitting units 110, 120, and 130. Consequently, the control unit varies the color temperature on the blackbody locus BL. The control unit is exemplified by a microcomputer. The microcomputer includes a memory and a manipulator. The memory stores the information indicating a relationship between an electrical current supplied to the light emitting units 110, 120, and 130, and the color temperature of the light emitted from the light emitting units 110, 120, and 130 upon receiving the electrical current. The microcomputer is configured to regulate the electrical current supplied to the light emitting units 110, 120, and 130 according to the color temperature designed by means of manipulation of the manipulator. FIG. 3 shows the relationship between electrical current value supplied to the light emitting units 110, 120, and 130 and the color temperature of the light emitted from the light emitting units 110, 120, and 130. The relationship shown in FIG. 3 is previously obtained by measurement of relationship between the electrical current supplied to the light emitting units 110, 120, and 130, and the color temperature of the light emitted from the light emitting units 110, 120, and 130.

Figure 4:
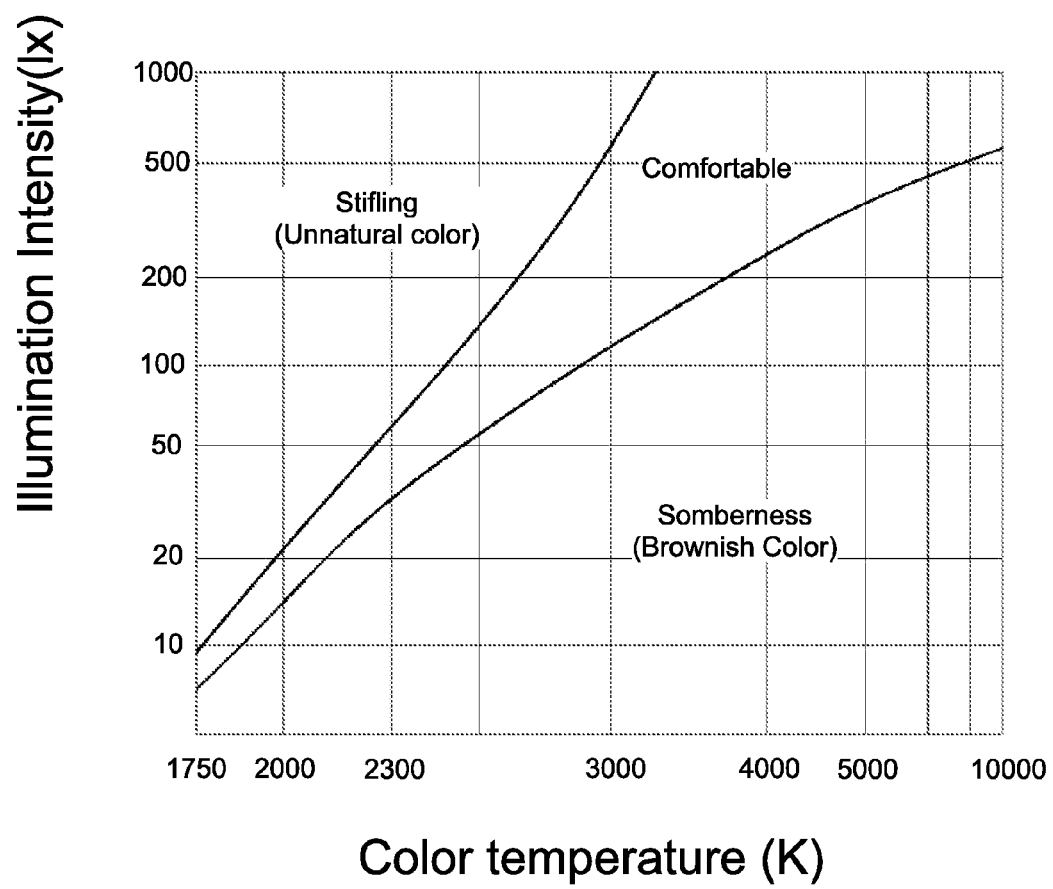
FIG. 4 is a graph showing a relationship between the color temperature and illumination intensity.

Moreover, a phenomenon of a cool zof effect is widely known as one psychological effect of the light to human. The cool zof effect is determined by the relation between the color temperature of the light and the illumination intensity. FIG. 4 shows a graph showing a feeling of the human according to the color temperature of the light and the illumination intensity. FIG. 4 shows that comfort of the human is varied according to the illumination intensity and the color temperature of the light. Therefore, it is preferred to vary the color temperature of the light produced from the LED lighting device as well as the illumination intensity of the light produced from the LED lighting device. Consequently, it is possible to obtain the LED lighting device being configured to produce the light which is comfortable for the human.

In contrast, an impression of the brightness is also known as one psychological effect of the light to human. The human feels darkness when the color temperature drops even the illumination intensity is evenness. Therefore, it is preferred to regulate the light flux in order to increase the illumination intensity when color temperature is low. Consequently, it is possible to obtain the LED lighting device being configured to produce the light having an approximately even brightness.

Furthermore, in this embodiment, it is preferred that the LED lighting device further comprises a light diffusion panel made of a transparent material. The light diffusion panel is disposed such that the light diffusion panel is faced with the circuit substrate 200. In this case, the light from the light emitting units 110, 120, and 130 are mixed with each other by the light diffusion panel. In addition, it is also preferred that the light emitting units 110, 120, and 130 are mounted on a base having a high heat conductivity instead of the circuit substrate 200. The base is exemplified by a component of a lighting fixture. In this case, the base is provided with a circuit substrate which is formed with apertures for exposing the light emitting units 110, 120, and 130.

Figure 5:
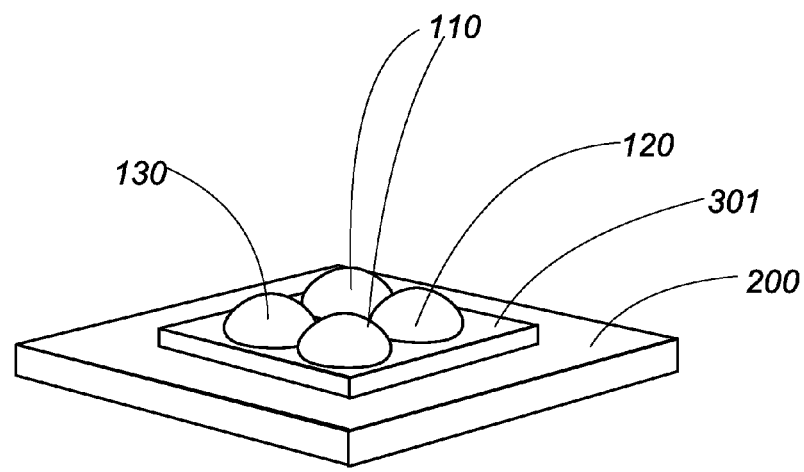
FIG. 5 (a) is a schematic perspective view of the LED lighting device of a second embodiment.
Figure 5:
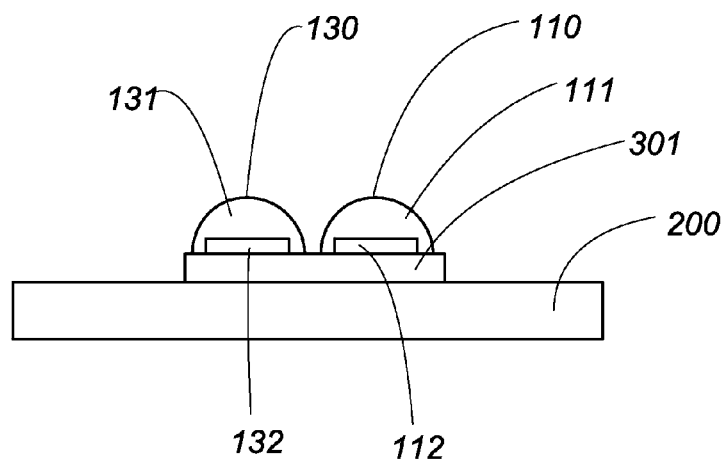

FIG. 5 shows a second modification of the first embodiment of the LED lighting device. The LED lighting device 400 in this modification comprises the light emitting units 110, 120, and 130 which are mounted on a mounting substrate 301.

In the LED lighting device 400 of this modification, all of the light emitting unit 110, 120, and 130 are mounted on the single mounting substrate 301. Therefore, this configuration makes it possible to arrange the light emitting units 110, 120, and 130 adjacent to each other. Therefore, this configuration prevents the color shift of the light produced from the LED lighting device. In addition, this configuration also prevents color separation of the LED lighting device. In addition, the light emitting units 110, 120, and 130 is composed of the LED chips 112, 122, and 132, respectively and the dome-shaped color conversion members 111, 121, and 131, respectively. However, it is preferred to employ the light emitting units which directly mounting the color conversion members, respectively. In this case, it is possible to arrange the light emitting units more adjacent to each other. Therefore, it is possible to obtain the LED lighting device which is prevented from the color separation.

Second Embodiment

A LED lighting device of the second embodiment is explained with attached illustrations. It is noted that the LED lighting device in the second embodiment comprises components same as the components of the first embodiment except for following features. Therefore, the same components are referred by same reference numerals. Therefore, explanations of the components explained in the first embodiment are omitted. Furthermore, in the illustrations, the components are represented by the reference numerals with suffix letter of "B".

Figure 6:
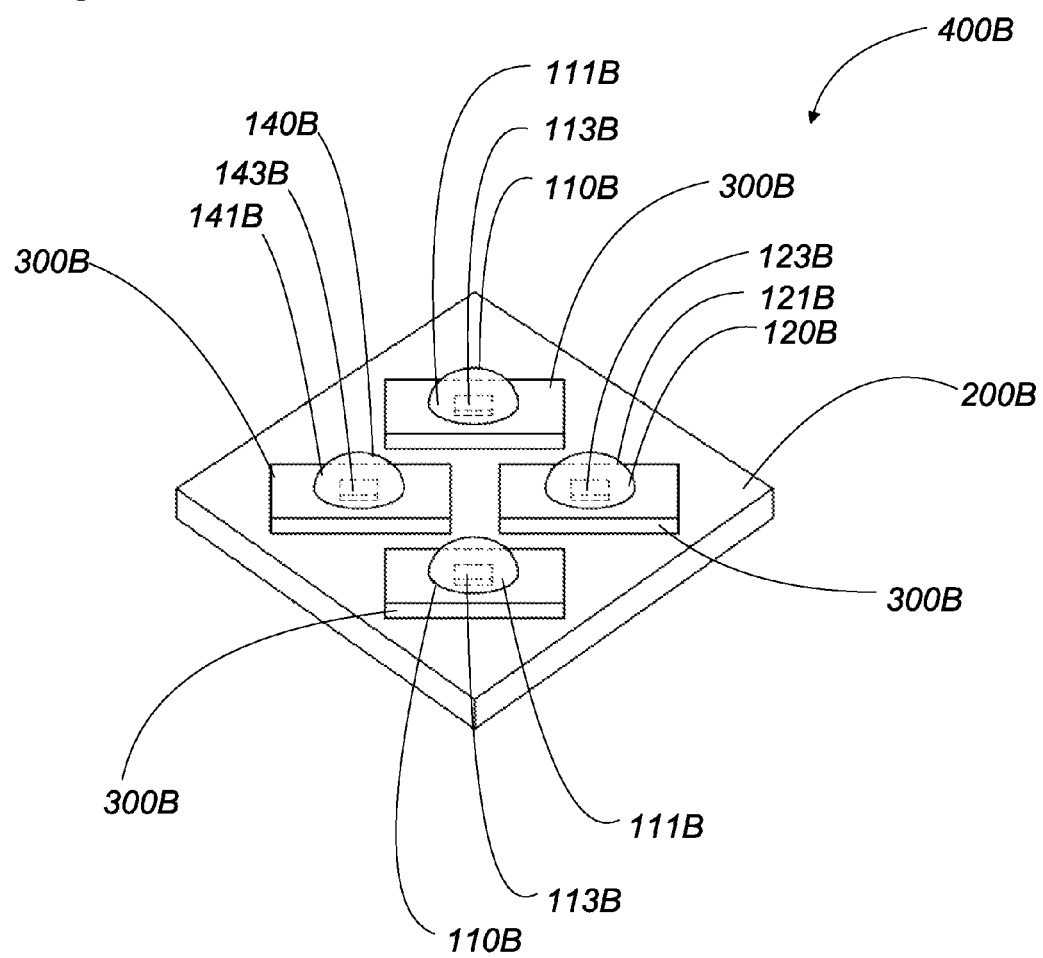
FIG. 6 is a schematic perspective view of the LED lighting device of the second embodiment.

FIG. 6 shows a schematic perspective view of the LED lighting device 400B in the second embodiment. The LED lighting device 400B of the second embodiment comprises the circuit substrate 200B, the mounting substrate 300B, the light emitting units 110B and 120B, the blue LED chip 143B, and a light diffusion member 141B. The light emitting units 110B, the light emitting unit 120B, and the blue LED chip 143B is mounted on the mounting substrate 300B. The mounting substrate 300B mounting the light emitting units 110B, 120, and the blue LED chip 143B is mounted on the circuit substrate 200B. The circuit substrate 200B is configured to supply the electrical current power to the light emitting units 110B, 120B, and the blue LED chip 143B upon receiving the electrical power. The light emitting units 110B, 120B are previously designed to emit the desired colors of lights, respectively. The light emitting units 110B, 120B, and the blue LED chip 143B is configured to emit the visible lights. The LED lighting device is configured to produce the white light by mixing the visible light emitted from the light emitting units 110B, 120B, and the blue LED chip 143B.

The light emitting unit 110B is composed of the blue LED chip 113B and the color conversion member 111B. The light emitting unit 120B is composed of the blue LED chip 123B and the color conversion member 121B. The blue LED chip 113B has the emission layer made of the composition which is same as the composition of the emission layer of the blue LED chip 123B. The blue LED chip 113B is configured to generate the light having an emission peak wavelength which is same as a emission peak wavelength of the light emitted from the blue LED chip 123B. The blue LED chip 113B has a structure which is same as a structure of the blue LED chip 123B. Each color conversion members 111B, 121B is composed of the phosphor and the transparent material. The phosphors have the properties to give off the lights having predetermined colors when the phosphors are excited by the lights emitted from the blue LED chips 113B and 123B. The color conversion member 111B includes the red phosphor which has a property of giving off the red light when the red phosphor is excited by the light from the blue LED chip 113B. The color conversion member 121B includes the green phosphor having a property of giving off the green light when the green phosphor is excited by the light from the blue LED chip 123B. Therefore, the light emitting unit 110B acts as the red light source being configured to emit the red light. The light emitting unit 120B acts as the green light source being configured to emit the green light. The transparent material is exemplified by the glass and the silicone resin. The color conversion members 111B and 121B are respectively formed to have a dome shape. Each the color conversion members 111B and 121B is cooperative with the mounting substrate 300B to incorporate the blue LED chip 113B and 123B between the color conversion members 111B, 121B and the mounting substrate 300B, respectively. The mounting substrate 300B is made of the ceramic substrate. In addition, the blue LED chip 113B and 123B has a property of generating the lights having the emission peak wavelengths which are shorter than the emission peak wavelength of the phosphor.

The blue LED chip 143B is cooperative with the light diffusion member 141B to construct the blue light source. The blue LED chip 143B has an emission layer made of composition which is same as the compositions of the blue LED chips 113B and 123B. The blue LED chip 143B is configured to emit the light having an emission peak wavelength which is same as the emission peaks of the light from the blue LED chips 113B and 123B. The blue LED chip 143B has a structure which is same as the structures of the blue LED chips 113B and 123B. The light diffusion member 141B is composed of a diffusion member and the transparent material. The diffusion member is made from a glass beads. The diffusion member is shaped to diffuse the light emitted from the blue LED chip 143B. The diffusion member is mixed with the transparent material. The transparent material is exemplified by the glass and the silicone resin. The light diffusion member 141B is formed to have a dome shape. The light diffusion member 141B is cooperative with the mounting substrate 300B to incorporate the blue LED chip 143B between the light diffusion member 141B and the mounting substrate 300B.

The LED lighting device comprises the red light source having the blue LED chip 113B, the green light source having the blue LED chip 123B, and the blue light source having the blue LED chip 143B. The blue LED chip 113B has the emission layer which is same as the emission layers of the blue LED chips 123B and 143B. The blue LED chip 113B is configured to generate the light having the emission peak wavelength which is same as the emission peak wavelength of the light from the blue LED chips 123B and 143B. The blue LED chip 113B has the structure which is same as the structures of the blue LED chips 123B and 143B. Therefore, each one of the blue LED chips 113B, 123B, and 143B has initial characterization which is same as the initial characterization of the other blue LED chips 113B, 123B, and 143B. Each property of the blue LED chips 113B, 123B, and 143B is similarly varied by the ambient environment and the aged deterioration. Therefore, it is possible to obtain the LED lighting device which is prevented from the color shift caused by the ambient environment and the aged deterioration. In addition, the light emitting units 110B, 120B has the color conversion members 111B and 121B which is different from each other. The blue LED chip 141B is combined with the light diffusion member 143B. Consequently, it is possible to obtain the LED lighting device being configured to produce the light having the high color reproducibility only by illumination of the light emitting units 110B, 120B and the blue LED chip 143B. In addition, the light emitting unit is configured to emit the light by excitation of the phosphor of the color conversion member 111B and 121B. Therefore, the light emitting units 110B and 120B are configured to emit the light which has low directionality. The light diffusion member 141B diffuses the light emitted from the blue LED chip 143B, and subsequently sent from the light diffusion member 141B. Therefore, the blue LED chip 143B is cooperative with the light diffusion member 141B to emit the light having the low directionality. Consequently, this configuration makes it possible for the LED lighting device to have the light emitting units 110B, 120B, and 143B which emit the lights which is easily mixed with each other.

Third Embodiment

An LED lighting device of the third embodiment is explained with attached illustrations. The components same as that in the first embodiment is referred to as the same reference numerals. Therefore, explanations of the components explained in the first embodiment are omitted. In addition, the components are referred to as the reference numerals with a suffix letter of "C".

Figure 7:
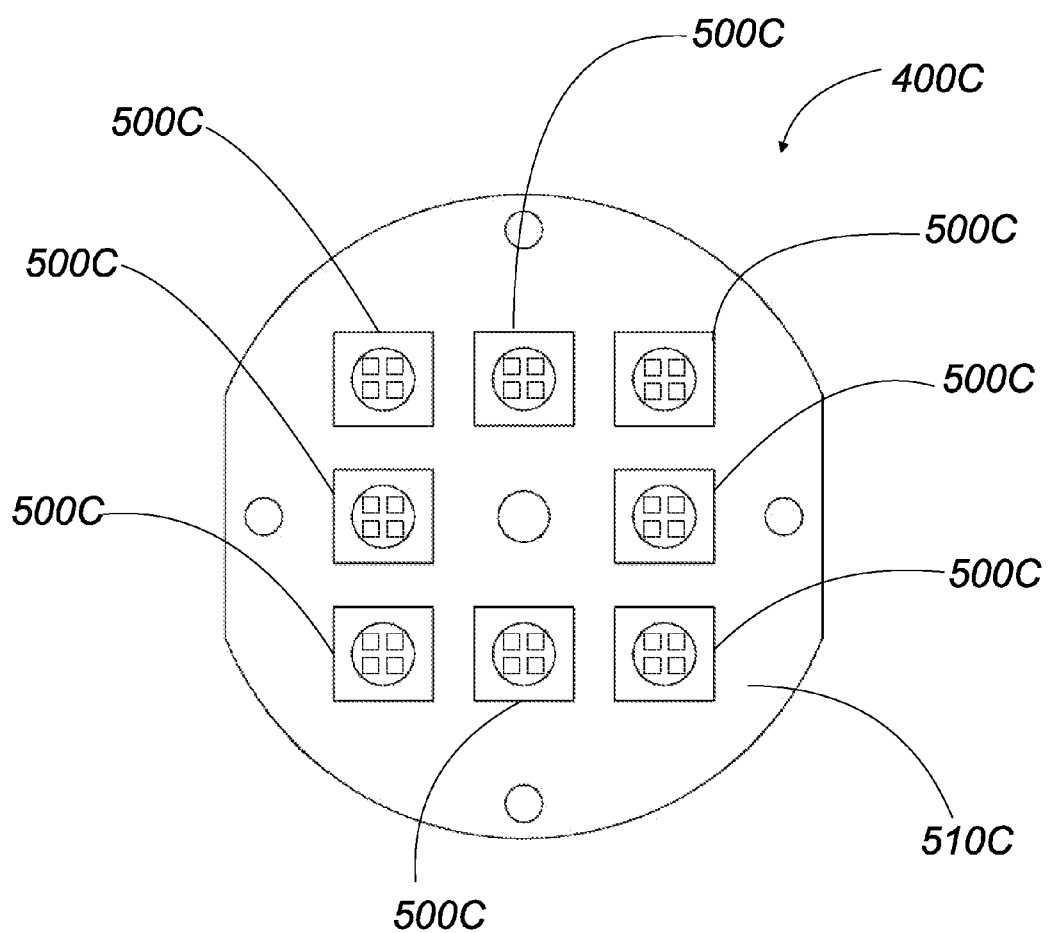
FIG. 7 is a top view of a LED lighting device in a third embodiment.
Figure 8:
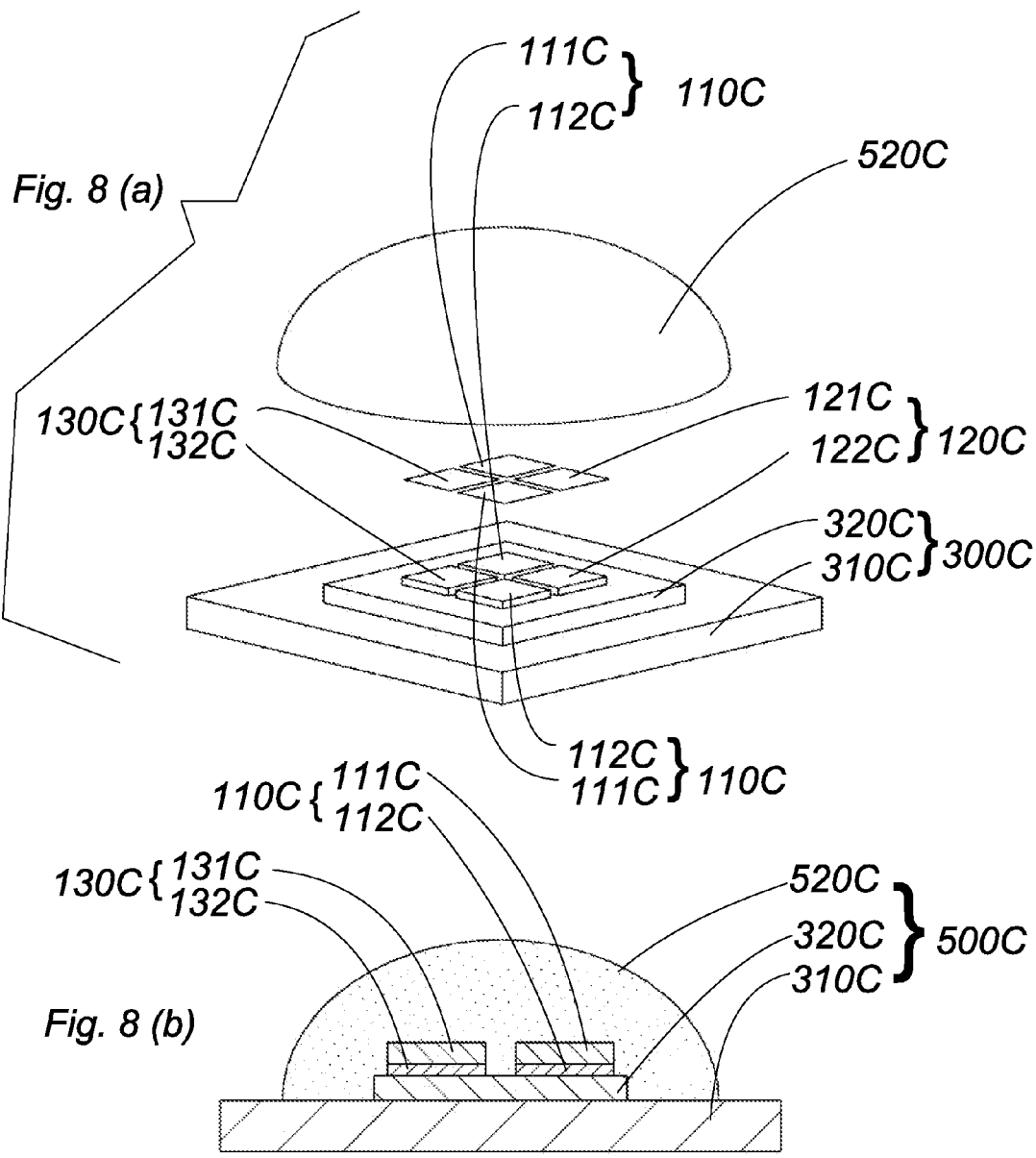
FIG. 8 (a) is a schematic perspective view of the light emitting unit of the third embodiment.

FIG. 7 shows the top view of the LED lighting device 400C in the third embodiment. FIG. 8 (a) shows a schematic perspective view of the LED lighting device 400C of the third embodiment. FIG. 8 (b) shows a side cross sectional view of the LED lighting device 400C of the third embodiment. The LED lighting device comprises a base 510C, a package 500C, and the light emitting units 110C, 120C, and 130C. The package 500C is composed of the mounting substrate 300C and a sealing cap 520C.

The base 510C is made of a heat conductive material such as Al and Cu. The base 510C is formed to have a circular plate.

The mounting substrate 300C is composed of a wiring substrate 310C and a stress relaxation substrate 320C. The stress relaxation substrate 320C is made of AlN. Stress is caused by the coefficient of thermal expansion between the wiring substrate 310C and the LED chips 112C, 122C, and 132C. However, the stress is relaxed by the stress relaxation substrate 320C. The stress relaxation substrate 320C is formed at its one surface with a wiring which is not shown. The wiring substrate 310 is made of the ceramic. However, it is not limited that the wiring substrate 310C is made of the ceramic. The wiring substrate is formed at its one surface with the wiring which is not shown.

Sealing cap 520 is made of the transparent material which is exemplified by the silicone resin, epoxy resin, acrylic resin, and the glass. The sealing cap 520C is formed at its one surface with a convex. The sealing cap 520C is formed with a recess so as to incorporate the light emitting units 110C, 120C, and 130C.

The light emitting unit 110C is composed of the LED chip 112C, and the color conversion member 111C. The light emitting unit 120C is composed of the LED chip 1220 and the color conversion member 121C. The light emitting unit 130C is composed of the LED chip 132C and the color conversion member 131C. Each light emitting units 110C, 120C, and 130C has a property which is same as the property of the light emitting units shown in the first embodiment. In addition, as shown in FIG. 8, the color conversion members 111C, 121C, and 131C are directly disposed on the LED chip 112C, 122C, and 132C respectively. However, it is possible to dispose the color conversion members indirectly on the LED chips through predetermined members. In addition, it is also possible to dispose the color conversion members which are spaced from the LED chips by air layers, respectively. In this case, support members are disposed such that the support member surrounds the LED chip 112C, 122C, and 132C. Then, the color conversion member 111C, 121C, and 131C are attached to the support members respectively. In this manner, the color conversion member 111C, 121C, and 131C are disposed to overlap with the LED chip 112C, 122C, and 132C, respectively.

The light emitting unit 110C, 120C, and 130C are disposed on the stress relaxation substrate 320C such that each one of the light emitting units 110C, 120C, and 130C are located adjacent to the other light emitting units 110C, 120C, and 130C. The stress relaxation substrate 320C with the light emitting units 110C, 120C, and 130C are mounted on the wiring substrate 310C. The sealing cap 520C is attached to the mounting substrate 300C such that the sealing cap 520C incorporates the light emitting units 110C, 120C, and 130C.

The LED lighting device in this embodiment comprises a plurality of the light emitting units 110C, 1200, and 130C. Each one of the light emitting units 110C, 120C, and 130C are arranged adjacent to each other. All light emitting units 110C, 120C, and 130C are incorporated in the one package. Therefore, this configuration makes it possible to narrow distance between the light emitting units 110C, 120C, and 130C. Consequently, the LED lighting device is configured to produce the light which causes no color separation around the shadow of the object.

Furthermore, the LED lighting device in this embodiment comprises a package 500C which incorporates the light emitting units 110C, 120C, and 130C. It is preferred that the LED lighting device is combined with the lens for distribution of the light. In this case, the light produced by the LED lighting device is directed to a desired direction. However, there is a possibility of the color unevenness of the light directed by the lens. In this case, it is preferred to employ the lens with a reflection surface which has irregularity. This lens is configured to diffuse the light. Therefore, the lights are mixed with each other by the lens.

Figure 9:
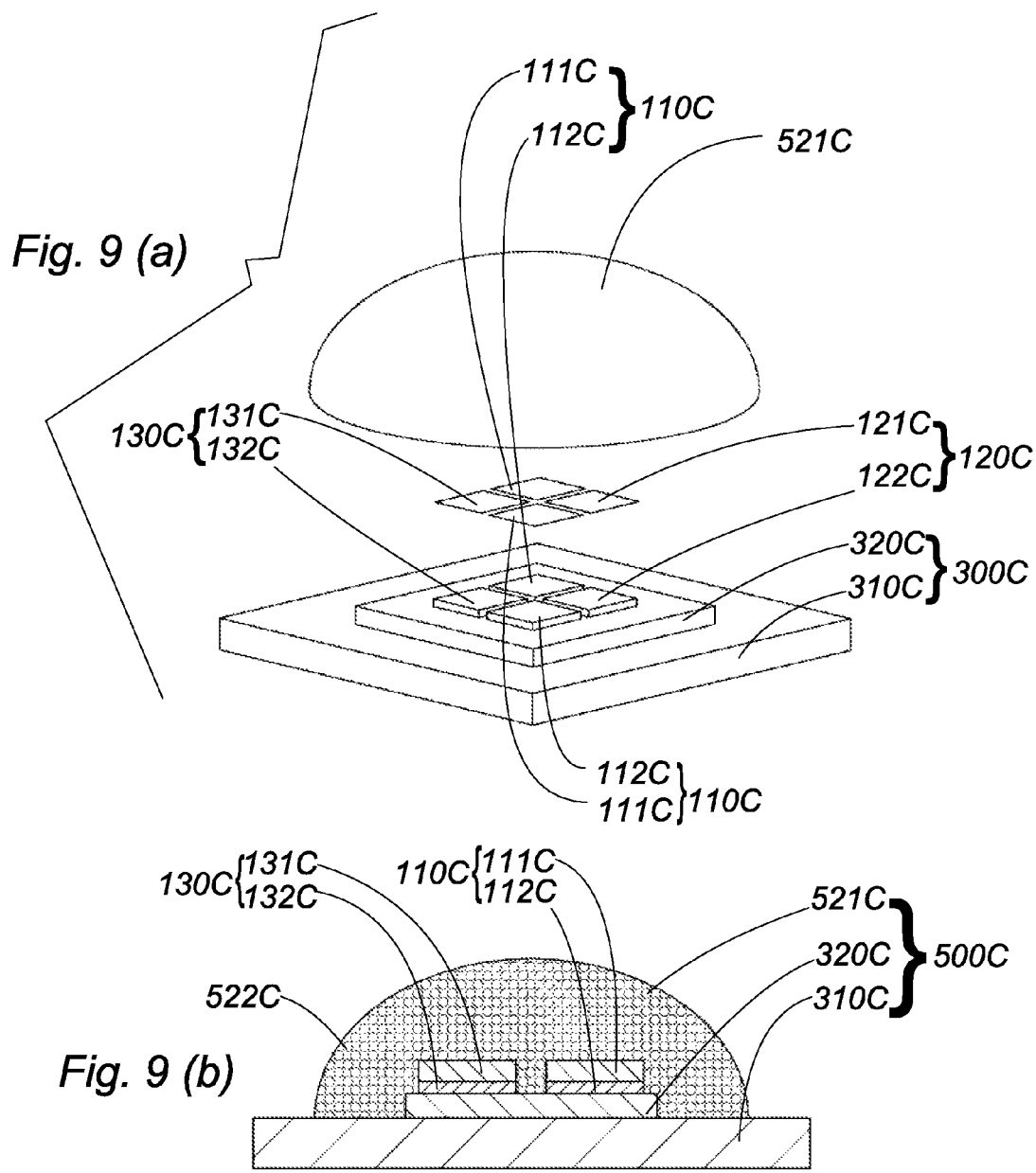
FIG. 9 (a) is a schematic perspective view of the light emitting unit in a first modification.

FIG. 9 shows the LED lighting device of a first modification of the third embodiment. The LED lighting device of this modification comprises a sealing cap 521C instead of the sealing cap 520C.

The sealing cap 521C has a light diffusion member 522C in addition to the components of the sealing cap 520C of the third embodiment. The light diffusion member 522C is mixed with the transparent material. Therefore, the light diffusion member 522C is cooperative with the transparent material to construct the sealing cap 521C.

The sealing cap 521C with the light diffusion member is configured to diffuse the light emitted from the light emitting units 110C, 120C, and 130C. That is, the sealing cap 521C with the light diffusion member 522C reduce the directionality of the light emitting units 110C, 120C, and 130C. Therefore, the diffused light is sent from the sealing cap. Consequently, the LED lighting device is configured to produce the light which causes no color separation around the shadow of the object when the light is irradiated to the object.

Figure 10:
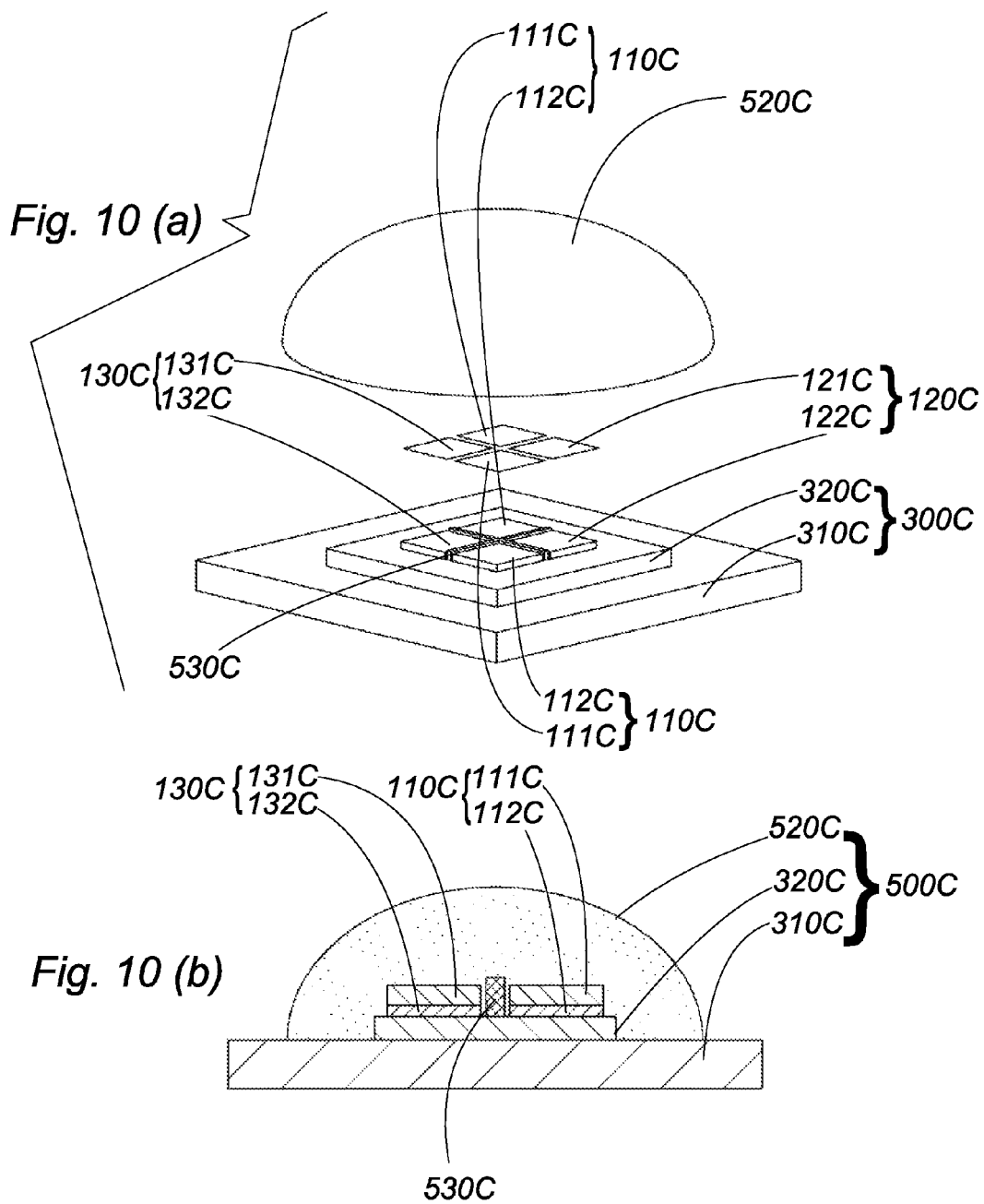
FIG. 10 (a) is a schematic perspective view of the light emitting unit in a second modification.

FIG. 10 shows a second modification of the LED lighting device in the third embodiment. In this modification, the package 500C further includes a light interception wall 530C.

The light interception wall 530C is disposed on the stress relaxation substrate 320 of the package 500C. The light interception wall 530C and the light emitting units 110C, 120C, and 130C are disposed on one surface of the stress relaxation substrate. The light interception wall 530C has a top which is located in an upper side with respect to a top of the light emitting units 110C, 120C, and 130C.

The light interception wall 530 prevent the light emitted from each one of the light emitting units 110C, 120C, and 130C from coming in the phosphor of the other light emitting units 110C, 120C, and 130C. Therefore, the light interception wall 530C prevents the light sent by each one of the light emitting units 110C, 120C, and 130C from reaching to the color conversion members 111C, 121C, and 131C of the other light emitting units 110C, 120C, and 130C.

Figure 11:
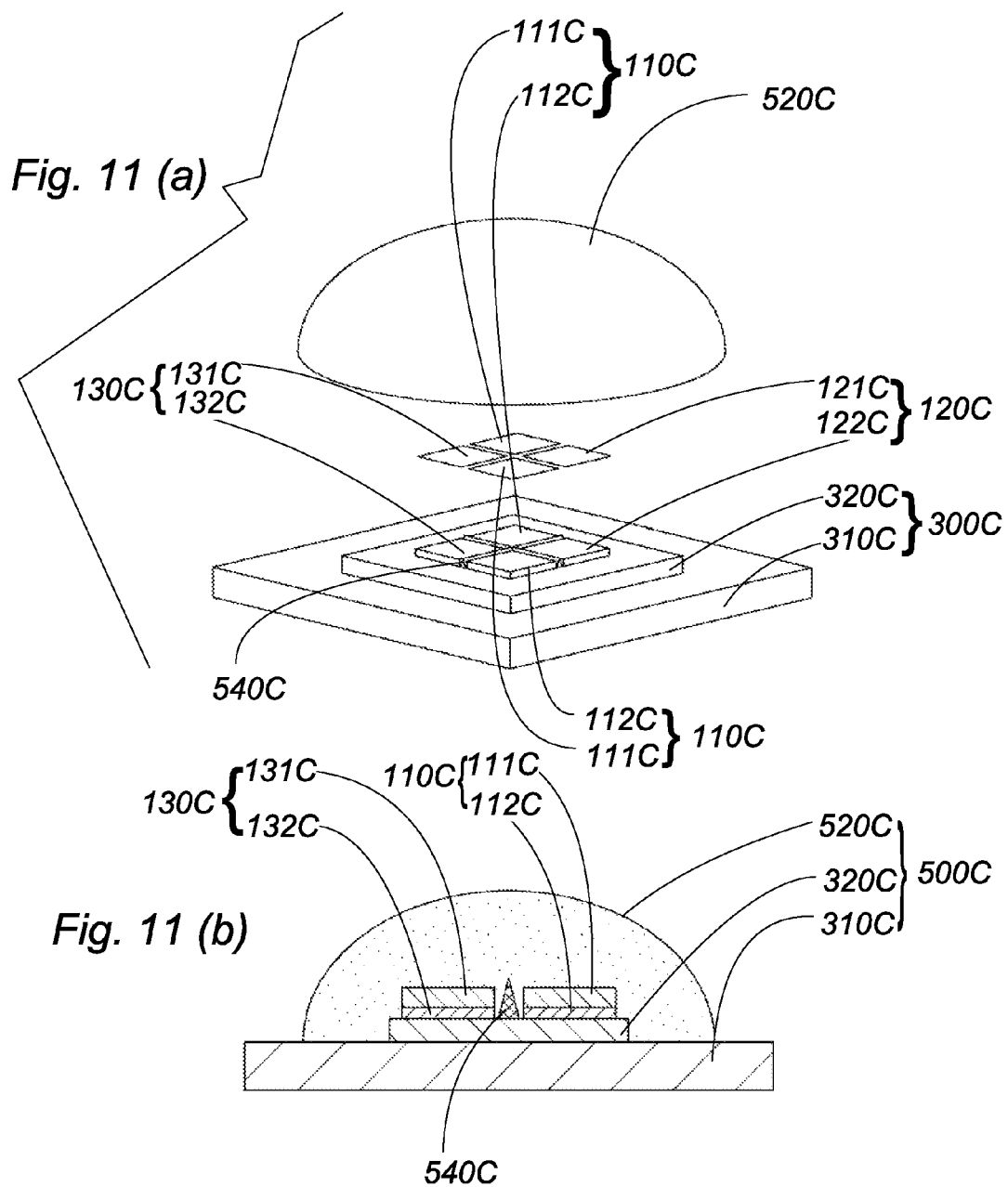
FIG. 11 (a) is a schematic perspective view of the light emitting unit in a third modification.

FIG. 11 shows a third modification of the LED lighting device of the third embodiment. In this modification, the package 500C further includes a reflection wall 540C.

The reflection wall 540C is disposed on the stress relaxation substrate 320C. The reflection wall 540C and the light emitting units 110C, 120C, and 130C are disposed on the same surface of the stress relaxation substrate 320C. The reflection wall 540C has a top which is located in an upper side with respect to a top of the light emitting units 110C, 120C, and 130C. The reflection wall 540C is made of a metal material having a high reflectance ratio. However, it is also possible to employ a reflection wall which is coated by the metal having the high reflectance ratio. It is also possible to employ a reflection wall coated by a white resist.

The reflection wall 540C prevent the light emitted from each one of the light emitting units 110C, 1200, and 130C from coming in the phosphors of the other light emitting units 110C, 120C, and 130C. Therefore, the reflection wall 540C prevents the light sent by each one of the light emitting units 110C, 120C, and 130C from reaching to the color conversion members 111C, 121C, 131C of the other light emitting units 110C, 120C, and 130C. In addition, the reflection wall 540C reflects the light emitted from the light emitting units 110C, 120C, and 130C. The light reflected by the reflection wall 540C is sent to the outside of the sealing cap 520C.

Figure 12:
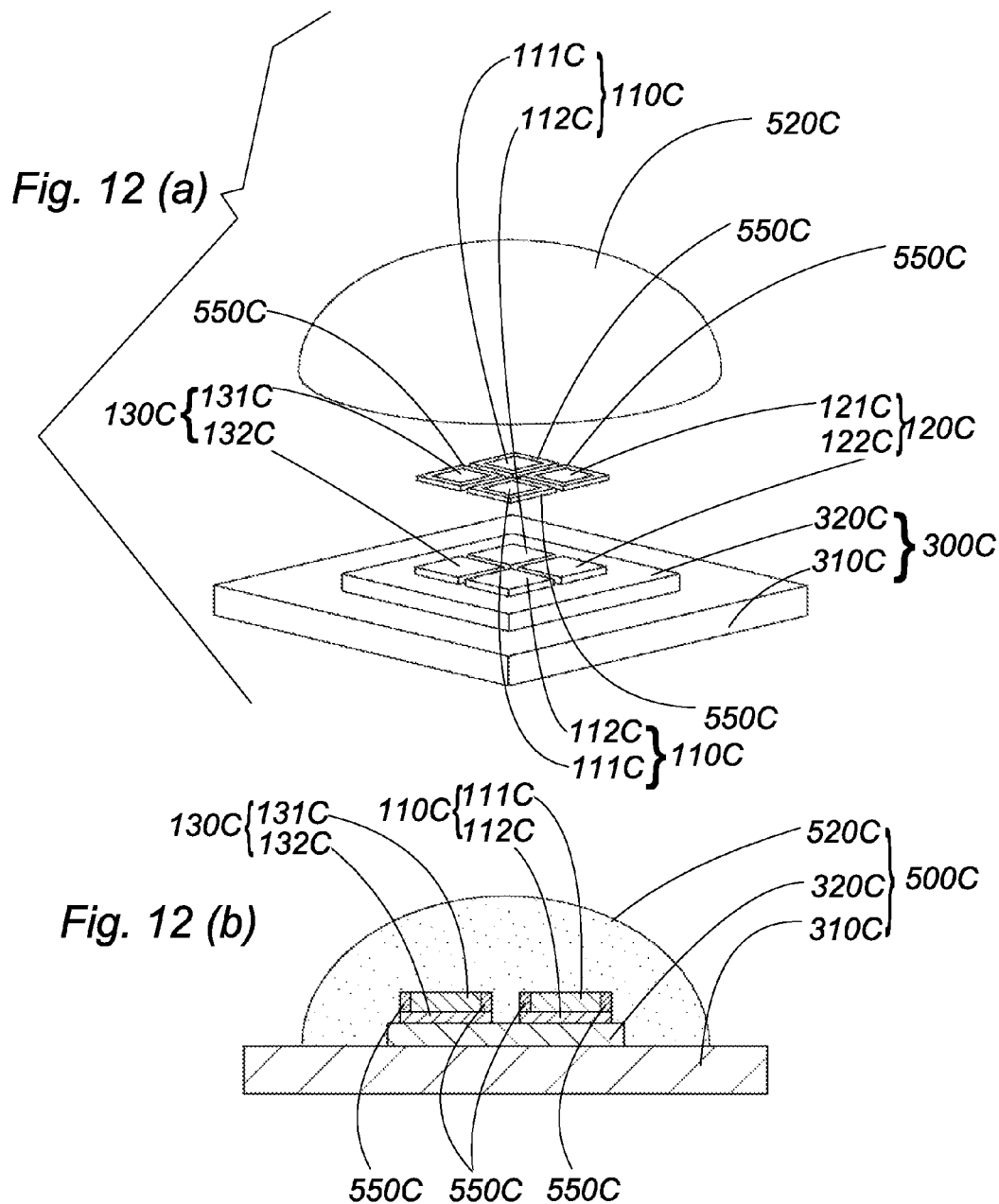
FIG. 12 (a) is a schematic perspective view of the light emitting unit in a fourth modification.

FIG. 12 shows a fourth modification of the LED lighting device of the third embodiment. In this modification, the lighting units 110C, 120C, and 130C have frames 550C, respectively.

The frame 550C and the color conversion members 111C, 121C, and 131C are disposed on top surfaces of the LED chips 112C, 122C, and 132C, respectively. The frames 550C are respectively located at circumferences of the top surfaces of the LED chips 112C, 122C, and 132C.

The frame 550C prevents the light sent by each one of the light emitting units 110C, 120C, and 130C, from coming in the phosphors of the other light emitting units 110C, 120C, and 130C. Therefore, the frame 550C prevents the lights emitted by each one of the light emitting units from reaching to the color conversion members 111C, 121C, and 131C.

Figure 13:
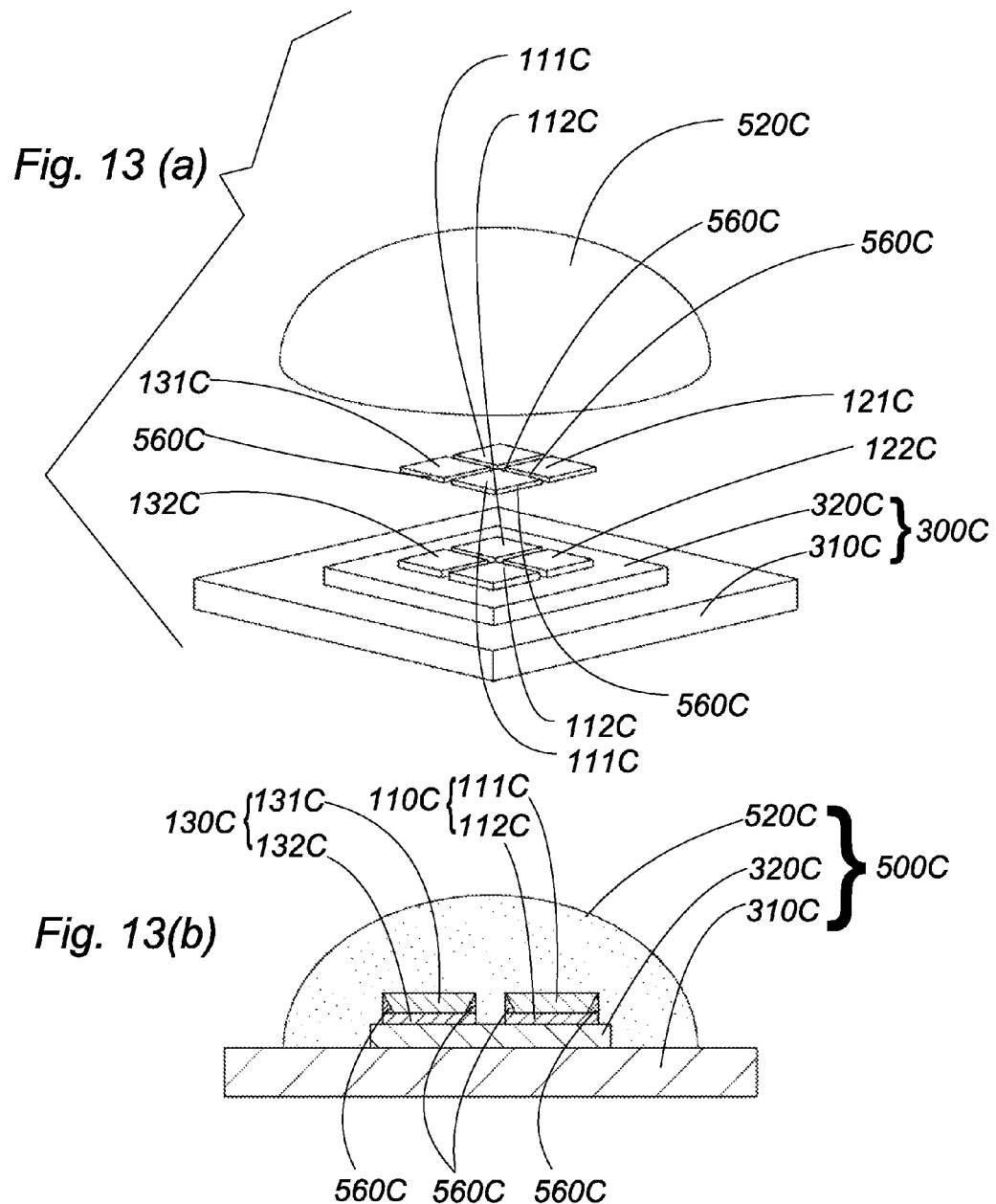
FIG. 13 (a) is a schematic perspective view of the light emitting unit in a fifth modification.

FIG. 13 shows a fifth modification of the LED lighting device of the third embodiment. In this modification, the light emitting units 110C, 120C, and 130C further include frames 560C, respectively.

The frames 560C and the color conversion members 111C, 121C, and 131C are respectively disposed on the top surface of the LED chips 112C, 122C, and 132C. The frames 560C are located at the circumferences of the top surface of the LED chips 112C, 122C, and 132C, respectively. The frame 560C is formed with an opening which has an opening area. The opening areas increase with increasing spacing from the LED chips 112C, 122C, and 132C.

The frame 560C prevents the lights emitted by each one of the light emitting units 110C, 120C, and 130C from coming in the phosphors of the color conversion members 111C, 121C, and 131C of the other light emitting units 110C, 120C, and 130C. Therefore, the frame 560C prevents the lights emitted by each of the light emitting unit 110C, 120C, and 130C from coming in the phosphors of the color conversion members 111C, 121C, and 131C of the other light emitting units 110C, 120C, and 130. Moreover, the LED lighting device comprises the light emitting units 110C, 120C, and 130C with the frames 560C, respectively. Therefore, the LED lighting device is configured to produce a large amount of the light which is directed to a predetermined direction. In addition, the frames 560C are made of the material having the high reflectance ratio. Therefore, the LED lighting device is configured to produce a large amount of the light which is directed toward the predetermined direction. The material having the high reflectance ratio is exemplified by the metal such as Al and Ag, and the resist having the white color.

Fourth Embodiment

The LED lighting device of the fourth embodiment is explained with attached illustrations. It is noted that components same as the components of the first embodiment, the second embodiment, and the third embodiment are referred to as the same reference numerals. Therefore, the explanation of the components shown in the first embodiment, the second embodiment, and the third embodiment are omitted. In addition, in the illustrations, the reference numerals with a suffix letter of "D" are represented with respect to the same components of the above.

Figure 14:
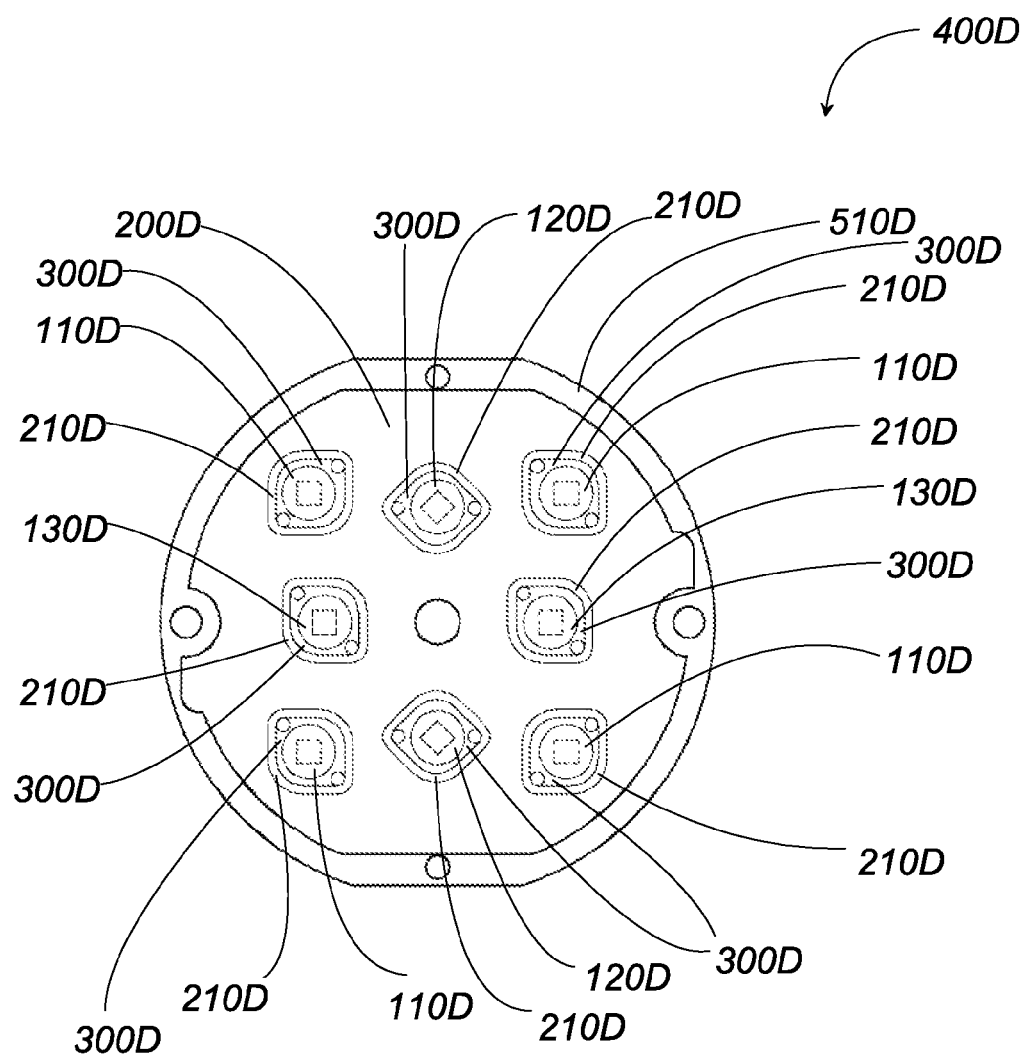
FIG. 14 is a top view of a LED lighting device of a fourth embodiment.
Figure 16:
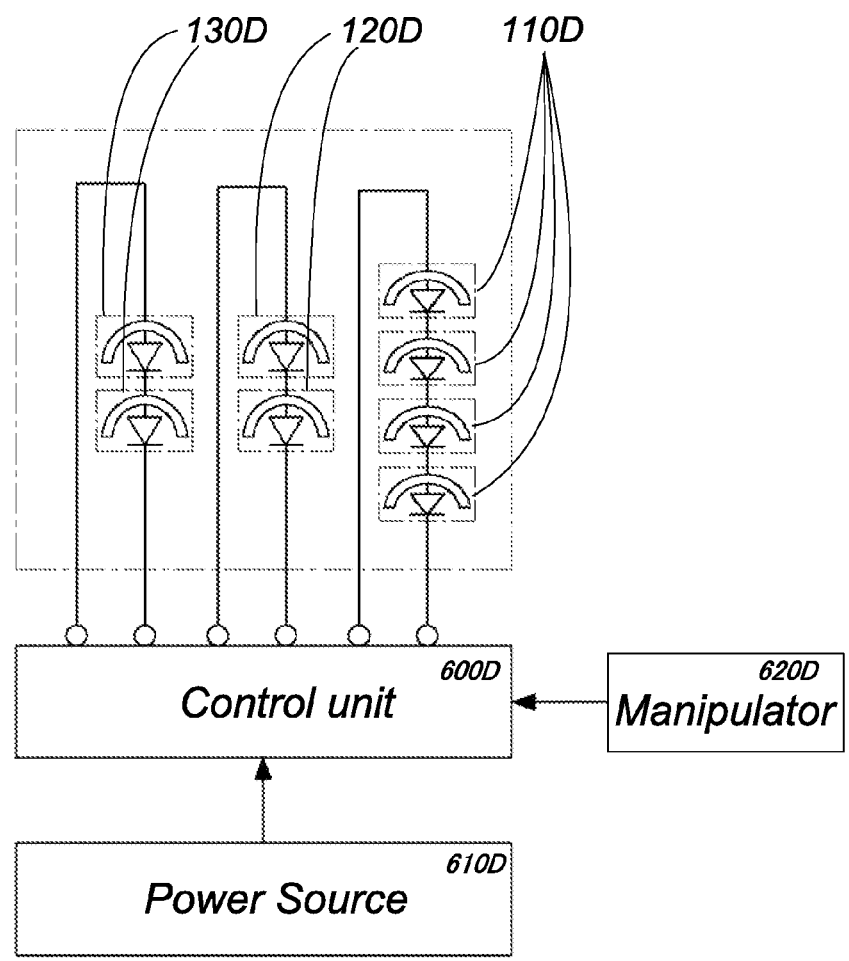
FIG. 16 is a schematic view showing the LED lighting device of the fourth embodiment, a control unit, and a power source.

FIG. 14 shows a top view of the LED lighting device of the fourth embodiment. FIG. 16 shows a schematic view of the LED lighting device in the fourth embodiment. The LED lighting device of the fourth embodiment comprises the base 510D, the circuit substrate 200D, the mounting substrate 300D, the light emitting units 110D, 120D, 130D, and the control unit 600D. The LED lighting device 400D receives the electrical power from the power source 610D disposed in an outside.

The light emitting units 110D, 120D, and 130D are composed of the blue LED chip 113, 123, and 133 respectively, and the color conversion member 111, 121, and 131 respectively. Each one of the blue LED chips 113, 123, and 133 has a composition which is same as a composition of the other blue LED chips 113, 123, and 133. Each one of the blue LED chips 113, 123, and 133 is configured to emit the light having an emission peak wavelength which is same as an emission peak wavelength of the light emitted from the other blue LED chips 113, 123, and 133. Each one of the blue LED chips 113, 123, and 133 has a structure which is same as a structure of the other blue LED chips 113, 123, and 133. The color conversion member 111, 121, and 131 are composed of the phosphors respectively, and the transparent materials respectively. The phosphors are configured to give off the light when the phosphors are excited by the light emitted from the blue LED chip 113, 123, and 133 respectively. The color conversion member 111 includes the phosphor which has a property of giving off the light when the phosphor is excited by the light generated by the blue LED chip 113. The color conversion member 111 is configured to give off the red light by mixing the light generated by the blue LED chip 113 with the light given off from the phosphor of the color conversion member 111. That is, the light emitting unit 110D includes the red phosphor, and is configured to emit the red light which is a mixture of the light generated by the blue LED chip with the light given off from the red phosphor. The color conversion member 121 includes the phosphor which has a property of being excited by the light generated by the blue LED chip 123. The color conversion member 121 is configured to give off the green light by mixing the light generated by the blue LED chip and the light given off from the phosphor of the color conversion member 121. That is, the light emitting unit 120D includes the green phosphor, and is configured to give off the green light which is a mixture of the light generated by the blue LED chip 123 and the light given off from the green phosphor. The color conversion member 131 includes the phosphor which has a property of being excited by the light generated by the blue LED chip 133. The color conversion member 133 is configured to give off the blue light by mixing the light generated by the blue LED chip 133 with the light of the phosphor of the color conversion member 131. That is, the light emitting unit 130D is configured to emit the blue light which is a mixture of the light generated by the blue LED chip 133 and the light given off from the phosphor of the light emitting unit 130D. Therefore, the light emitting unit 110 acts as the red light source. The light emitting unit 120 acts as the green light source. The light emitting unit 130 acts as the blue light source. The transparent material is exemplified by the glass, the silicone resin, the acrylic resin. The transparent material is also exemplified by an organic hybrid material which includes organic constituent and inorganic constituent which are mixed and coupled with each other in nanometer order or molecule order. The color conversion member 111, 121, and 131 are respectively formed into dome shape. Each of the color conversion members 111, 121, and 131 is cooperative with the mounting substrate 300D to incorporate each of the blue LED chips 113, 123, and 133. The mounting substrate 300D is made of the ceramic. However, the material of the mounting substrate 300D is not limited to the ceramic. In addition, the blue LED chip 113, 123, and 133 respectively have properties of emitting the light having the emission peak wavelength which is shorter than the emission peak wavelength of the light given off from the phosphors.

The circuit substrate 200D is made of a glass epoxy resin having an electrical insulation property. It is also possible to employ the circuit substrate made of a polyimide series resin, and a phenol series resin. The circuit substrate 200D is provided at its one surface with a wiring which is not shown in the illustrations. A wiring is provided for supplying the electrical power to the light emitting units 110D, 120D, and 130D. The circuit substrate 200D is formed to have a circular shape. However, it is possible to employ a circuit substrate formed to have a shape other than the circular shape. The circuit substrate 200 is formed with openings 210D. The openings 210D respectively have dimensions for placing the light emitting units 110D, 120D, and 130D within the openings 210D. The light emitting unit 110D, 120D, and 130D receives the electrical current from the power source disposed in the outside, and through the wiring of the circuit substrate 200D and the base 510D.

Each light emitting units 110D, 120D, and 130D is attached to the base 510D through a flexible sheet. The flexible sheet has a high heat conductive property and a high thermal hydraulics property. The flexible sheet is exemplified by a resin sheet with fillers such as silica and alumina. This resin sheet has a property of low-viscosity property when the resin sheet when heated. The light emitting units 110D, 120D, and 130D are fixed to the base 510D through the flexible sheet of being plastically deformed. In this case, it is possible to reduce heat thermal resistance between the LED chip 113, 123, 133 and the base 510D. In addition, it is possible to reduce variability of the thermal resistance between the LED chips 113, 123, 133 and the base 510D. That is, this configuration makes it possible to enhance heat release performance from the LED chips 113, 123, 133 to the base 510D. In addition, the flexible sheet prevents raise of the junction temperature of the LED chips 113, 123, and 133. Therefore, this configuration makes it possible to supply a large amount of the electrical power to the LED chips 113, 123, and 133. Consequently, it is possible to obtain the LED lighting device having a high light output.

Figure 15:
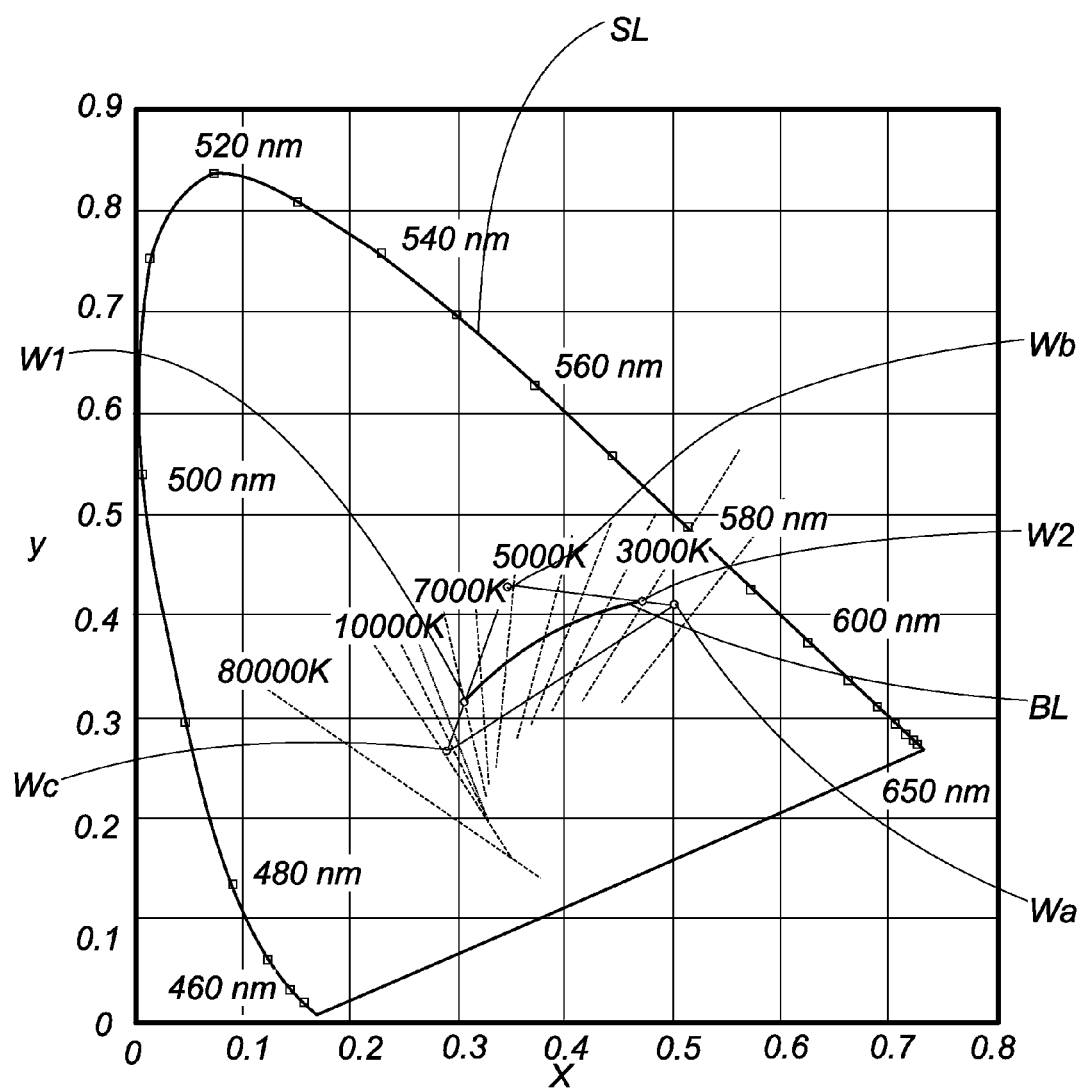
FIG. 15 is a x,y, chromaticity diagram showing a color temperature of light emitted from the LED lighting device of the fourth embodiment.

The LED lighting device 400D with the above configuration is designed as follows. FIG. 15 shows the x,y, chromaticity diagram of the XYZ color system and the blackbody locus BL in the x,y, chromaticity diagram. The light emitting unit 110D is configured to emit the light having a color of the chromaticity point Wa shown in FIG. 15. The light emitting unit 120D is configured to emit the light having a color of the chromaticity point Wb. The light emitting unit 130D is configured to emit the light having a color of the chromaticity point Wc. The chromaticity point Wc and the chromaticity point Wb are located at positions such that a first line connecting the chromaticity point Wc and the chromaticity point Wb passes through the high temperature end W1 of the blackbody locus BL. In this embodiment, as shown in FIG. 15, the high temperature end is equal to 7000K. The chromaticity point Wa and the chromaticity point Wb are located at position such that a second line connecting the chromaticity point Wa and the chromaticity point Wb passes through the low temperature end W2 of the blackbody locus BL. In this embodiment, the low temperature end is equal to 2500K. A third line is defined as connecting the chromaticity point Wa and the chromaticity point Wc, and has Y-axis value of a chromaticity coordinate of the x,y, chromaticity diagram. A fourth line is defined as connecting the high temperature end W1 and the low temperature end W2. The fourth line has a Y-axis value of the chromaticity coordinate. The Y-axis value of the third line is smaller than the Y-axis value of the fourth line. Therefore, when a X-axis value of the third line is equal to a X-axis value of the fourth line, the Y-axis value of the third line is smaller than the Y-axis value of the fourth line. That is, the LED lighting device in this embodiment comprises the light emitting units 110D, 120D, and 130D respectively being configured to emit the lights having the colors corresponding to the positions within the spectral locus SL. In addition, the light emitting units 110D, 120D, and 130D being respectively configured to emit the lights having the colors corresponding to the chromaticity points Wa, Wb, and Wc satisfying the above conditions. Consequently, the LED lighting device is configured to produce the white light surrounded by a triangle defined by the first, the second, and the third lines respectively connecting the chromaticity points Wa, Wb, and Wc. In this embodiment, the color of the light within the triangle surrounded by the first line, the second line, and the third line connecting the Wa, Wb, and Wc is white.

Figure 17:
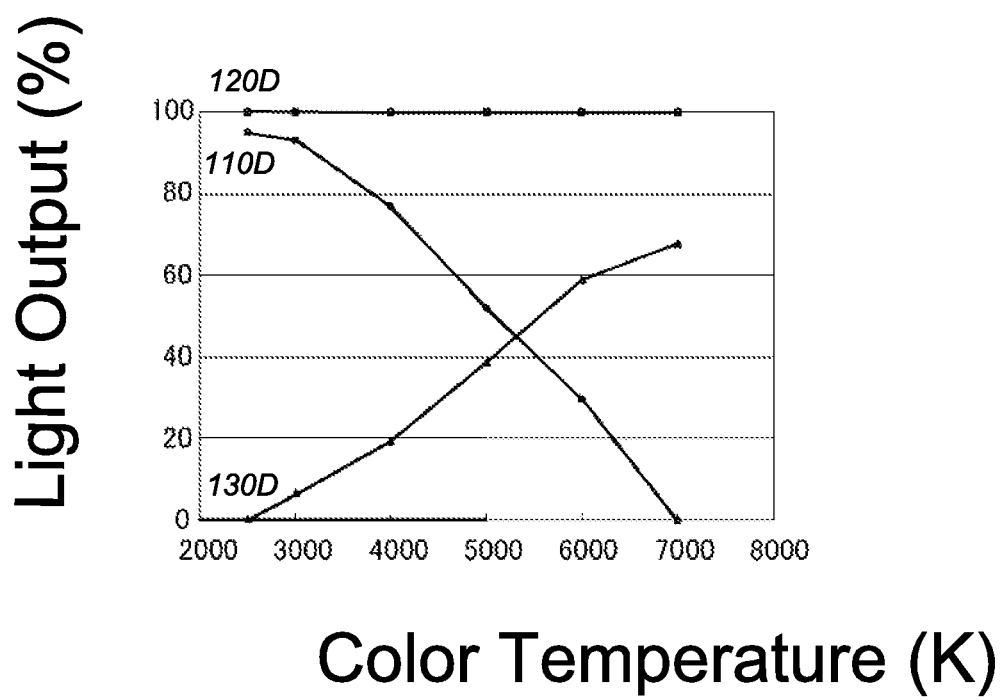
FIG. 17 shows a graph showing a relationship between the color temperature and a light output of the light emitting unit of the fourth embodiment.

In addition, the LED lighting device comprises the control unit 600D which is configured to regulate the electric power supplied to the light emitting units 110D, 120D, and 130D from the power source. The control unit 600D includes a memory which is not shown. The control unit 600D is provided with a manipulator 620D for regulating the electrical current supplied to the light emitting unit 110D, 120D, and 130D. The control unit 600D is configured to control the light emitting unit 110D, 120D, and 130D on the basis of regulation of the manipulator 620D. The memory stores the relationship between the light emitting units 110D, 120D, 130D and the light output of the light emitted by the light emitting units 110D, 120D, 130D upon receiving the electrical current. FIG. 17 shows the relationship between the light output of the light emitted from the light emitting units 110D, 120D, and 130D and value of the electrical current supplied to the light emitting units 110D, 120D, 130D. The relationship shown in FIG. 17 is previously obtained by measurement of the light output of the light emitting units 110D, 120D, and 130D according to the electrical current supplied to the light emitting units 110D, 120D, and 130D.

The LED lighting device of this embodiment is configured to provide the light with an evenness light output of the light emitting unit 120D, and is also configured to regulate the light output of the light emitting units 110D and 130D in order to regulate the color temperature. That is, this configuration makes it possible to regulate the color temperature by maintaining the light output of the green light source, and also by regulating the light output of the red light source and the blue light source. Therefore, it is possible to employ the control circuit having a simple configuration. In addition, it is also possible to obtain the LED lighting device being configured to regulate the color temperature of the light produced from the LED lighting device. Furthermore, this configuration makes it possible obtain the LED lighting device of low cost.

The invention claimed is:

1. An LED lighting device comprising:
a plurality of light emitting units configured to emit visible lights having different colors which are mixed with each other to produce a white light, wherein:
each of said light emitting units is composed of an LED chip configured to generate light, and a phosphor having a property of giving off a light of a predetermined color when said phosphor is excited by the light from said LED chip,
said LED chip is selected from a group consisting of a blue LED chip, a UV LED chip, and a violet LED chip,
each said phosphor is selected to give off the light of a predetermined color different from one another,
said LED lighting device includes a first light emitting unit, a second light emitting unit, and a third light emitting unit, each of said first light emitting unit, said second light emitting unit and said third light emitting unit having a blackbody locus of x,y, chromaticity diagram of XYZ color system, said blackbody locus having a first chromaticity point and a second chromaticity point,
a third chromaticity point is located at an intersection of a first tangential line at said first chromaticity point on said blackbody locus and a second tangential line at said second chromaticity point on the black body locus, whereby, the blackbody locus is configured to form a triangle having three corners of said first chromaticity point, said second chromaticity point and said third chromaticity point,
said x,y, chromaticity diagram comprises a spectral locus and a linear locus locating between lower end terminals of said spectral locus,
said spectral locus and said linear locus respectively have a fourth chromaticity point and a fifth chromaticity point which locate on a first line, said first line being parallel to a bisector of angle at said third chromaticity point and passing through said first chromaticity point,
said spectral locus and said linear locus respectively have a sixth chromaticity point and a seventh chromaticity point which locate on a second line, said second line being parallel to said bisector of angle at said third chromaticity point and passing through said second chromaticity point,
said spectral locus further comprises an eighth chromaticity point and a ninth chromaticity point, said eighth chromaticity point and said ninth chromaticity point locating on a third line, said third line passing through said first chromaticity point and said second chromaticity point,
said spectral locus further comprises a first region, a second region and a third region,
said first region locates so as to be surrounded by said first line between said first chromaticity point and said fifth chromaticity point, said third line between said first chromaticity point and said eighth chromaticity point and a fourth line between said fifth chromaticity point and said eighth chromaticity point, said fourth line being formed so as to connect said spectral locus and said linear locus,
said second region locates so as to be surrounded by said first line between said first chromaticity point and said fourth chromaticity point, said second line between said second chromaticity point and said sixth chromaticity point and a curving line of said spectral locus between said fourth chromaticity point and said sixth chromaticity point,
said third region locates so as to be surrounded by said second line between said second chromaticity point and said seventh chromaticity point, said third line between said second chromaticity point and said ninth chromaticity point and a fifth line between said seventh chromaticity point and said ninth chromaticity point, said fifth line being formed so as to connect said spectral locus and said linear locus, and
said first light emitting unit, said second light emitting unit and said third light emitting unit are respectively configured to have a tenth chromaticity point, an eleventh chromaticity point and a twelfth chromaticity point, said tenth chromaticity point locating in said first region, said eleventh chromaticity point locating in said second region, and said twelfth chromaticity point locating in said third region.

2. The LED lighting device as set forth in claim 1, wherein said light emitting units are configured to emit the lights having colors which respectively correspond to chromaticity points on said x,y, chromaticity diagram, said chromaticity points being located at corners of a polygonal shape which surrounds a triangle having three corners of said tenth chromaticity point, said eleventh chromaticity point and said twelfth chromaticity point.

3. The LED lighting device as set forth in claim 1, wherein the LED lighting device includes three light emitting units.

4. The LED lighting device as set forth in claim 1, wherein:
said LED lighting device includes a first light emitting unit, a second light emitting unit, and a third light emitting unit,
said first light emitting unit is configured to emit red light which is produced by the light generated from said LED chip of said first light emitting unit mixed with the light given off from said phosphor of said first light emitting unit,
said second light emitting unit is configured to emit green the light which is produced by light generated from said LED chip of said second light emitting unit mixed with the light given off from said phosphor of said second light emitting unit, and
said third light emitting unit is configured to emit blue light which is produced by the light generated from said LED chip of said third light emitting unit mixed with the light given off from said phosphor of said third light emitting unit.

5. The LED lighting device as set forth in claim 1, wherein:
said light emitting units share plural kinds of said phosphors in common, and
said light emitting units including said kinds of the phosphors in respective mixture ratio different from each other.

6. The LED lighting device as set forth in claim 1, wherein:
the light emitting units are defined by a first light emitting unit and a second light emitting unit,
said first light emitting unit includes said phosphor configured to give off red light when the phosphor of the first light emitting unit is excited by the light from the blue LED chip,
said second light emitting unit includes said phosphor configured to give off green light when said phosphor of the second light emitting unit is excited by the light from the blue LED chip,
the LED lighting device further comprises a third blue LED chip with a light diffusion member,
said blue LED chips is same in type with respect to each other, and
said light diffusion member being configured to diffuse the blue light from the third blue LED chip.

7. The LED lighting device as set forth in claim 1, wherein:
said LED lighting device further comprises a package which is configured to incorporate the light emitting units therein,
said phosphors is disposed to overlap with said LED chip, and
each said light emitting unit is arranged adjacent to said other light emitting unit within said package.

8. The LED lighting device as set forth in claim 7, wherein:
said package is composed of a mounting substrate and a sealing cap,
said mounting substrate has one surface which mounts a plurality of said light emitting units,
said sealing cap is disposed on said one surface of said mounting substrate such that said sealing cap seals the light emitting units between the sealing cap and the mounting substrate, and
said sealing cap is made of transparent material having a light diffusion member.

9. The LED lighting device as set forth in claim 7, wherein said package further includes a light interceptor, said light interceptor being located between the light emitting units adjacent to each other, and
said light interceptor is shaped to intercept the light sent from the one of the light emitting units to the other the light emitting units.

10. The LED lighting device as set forth in claim 7, wherein:
said package further includes a light reflector, said light reflector being located between the light emitting units adjacent to each other, and
the light reflector is shaped to intercept the light sent from the one of the light emitting units to the other the light emitting units.

11. The LED lighting device as set forth in claim 7, wherein:
each said light emitting unit further including a frame which surrounds said phosphor over an entire side surface of the phosphor, and
said frame is shaped to reflect the light from said phosphor.

12. The LED lighting device as set forth in claim 11, wherein said frame is formed with an opening which has an opening area which gradually increase toward a direction away from said LED chip.

13. The LED lighting device as set forth in claim 1, wherein:
said LED lighting device is configured to emit the mixed color light having the white color within a desired color temperature range which is defined by the blackbody locus of x,y, chromaticity diagram of XYZ color system,
said LED lighting device comprises a red light emitting unit, a green light emitting unit, and a blue light emitting unit,
said red light emitting unit is configured to emit a red light which is produced by the light generated from said LED chip and the light which is given off from said phosphor,
said green light emitting unit is configured to emit a green light produced by the light generated from said LED chip and the light which is given off from said phosphor,
said blue light emitting unit is configured to emit a blue light produced by the light generated from said LED chip and the light which is given off from said phosphor,
a first line is defined as connecting a chromaticity point of the color of the light which is emitted from said blue light emitting unit and a chromaticity point of the color of the light which is emitted from said green light emitting unit, said first line passing through a high-temperature end of the blackbody locus within a predetermined color temperature range,
a second line is defined as connecting a chromaticity point of the color of the light which is emitted from said red light emitting unit and a chromaticity point of the color of the light which is emitted from said green light emitting unit, said second line passing through a low-temperature end of the blackbody locus within a predetermined color temperature range,
a third line is defined as connecting a chromaticity of the color of the light which is emitted from said blue light emitting unit and a chromaticity point of the color of the light which is emitted from said red light emitting unit, the third line having Y-axis value of the chromaticity coordinate, and a fourth line is defined as connecting the high-temperature end and the low temperature end, and the Y-axis value of the third line being smaller than Y-axis value of the fourth line.

14. The LED lighting device as set forth in claim 2, wherein:

the light emitting units are defined by a first light emitting unit and a second light emitting unit, said first light emitting unit has said phosphor configured to give off red light when the phosphor of the first light emitting unit is excited by the light from the blue LED chip, said second light emitting unit has said phosphor configured to give off the green light when said phosphor of the second light emitting unit is excited by the light from the blue LED chip, the LED lighting device further comprises a third blue LED chip with a light diffusion member, said blue LED chips is same in type with respect to each other, and said light diffusion member is configured to diffuse the blue light from the third blue LED chip.

15. The LED lighting device as set forth in claim 8, wherein:

said package further includes a light interceptor, said light interceptor being located between the light emitting units adjacent to each other, and said light interceptor is shaped to intercept the light sent from the one of the light emitting units to the other the light emitting units.

16. The LED lighting device as set forth in claim 8, wherein:

said package further includes a light reflector, said light reflector being located between the light emitting units adjacent to each other, and the light reflector is shaped to intercept the light sent from the one of the light emitting units to the other the light emitting units.

17. The LED lighting device as set forth in claim 8 wherein:

each said light emitting unit further includes a frame which surrounds said phosphor over an entire side surface of the phosphor, and said frame is shaped to reflect the light from said phosphor.

18. The LED lighting device as set forth in claim 17, wherein said frame is formed with an opening which has an opening area which gradually increase toward a direction away from said LED chip.

19. The LED lighting device as set forth in claim 1, wherein said first chromaticity point, said tenth chromaticity point and said eleventh chromaticity point are located on a straight line.

* * * * *